(12) United States Patent  
Forman et al.

(10) Patent No.: US 7,436,333 B2  
(45) Date of Patent: Oct. 14, 2008

(54) ASYNCHRONOUS SAMPLE RATE CONVERTER

(75) Inventors: Dustin D. Forman, Kelowna (CA); Andrew Martin Mallinson, Kelowna (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 11/946,751

(22) Filed: Nov. 28, 2007

(65) Prior Publication Data  
US 2008/0068234 A1 Mar. 20, 2008

Related U.S. Application Data

(63) Continuation of application No. PCT/US2007/076048, filed on Aug. 15, 2007.

(60) Provisional application No. 60/838,105, filed on Aug. 15, 2006.

(51) Int. Cl.  
*H03M 7/00* (2006.01)

(52) U.S. Cl. .......................................... 341/61; 708/313  
(58) Field of Classification Search ................... 341/61; 708/313  
See application file for complete search history.

(56) References Cited

U.S. PATENT DOCUMENTS

| | | | | |
|---|---|---|---|---|
| 5,159,339 | A | * | 10/1992 | Fujita ............................ 341/61 |
| 5,559,513 | A | * | 9/1996 | Rothermel et al. ........... 708/313 |
| 2002/0190880 | A1 | * | 12/2002 | McLaughlin et al. ........... 341/61 |
| 2005/0163276 | A1 | * | 7/2005 | Sudo et al. ................... 375/372 |

OTHER PUBLICATIONS

Analog Devices "192 kHz Stereo Asynchronous Sample Rate Converter" 2003 pp. 1-27. Data Sheet for AD1896.

* cited by examiner

*Primary Examiner*—Howard Williams  
(74) *Attorney, Agent, or Firm*—Kenta Suzue; Haynes Beffel & Wolfeld LLP

(57) ABSTRACT

Various embodiments perform sample rate conversion of a sample series at an input rate to an output rate. A version of the sample series is corrected with timing error information generated by a digital loop. The digital loop is locked to a first rate and clocked at a second rate.

32 Claims, 24 Drawing Sheets

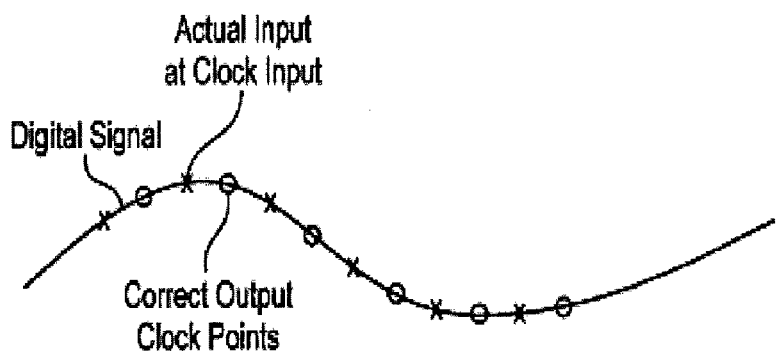
FIG. 2B
FIG. 2C
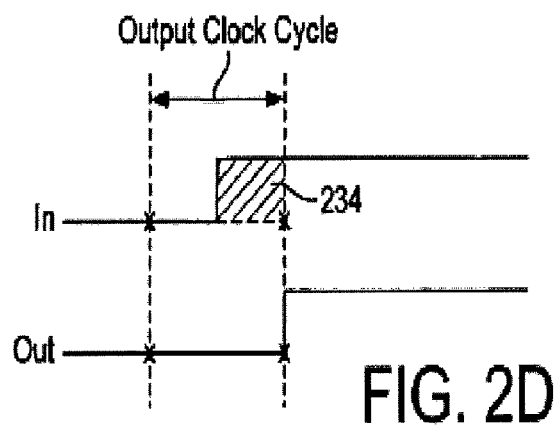
FIG. 2D (A) $$\int_0^{\Delta T} i(x)\delta x = \int_0^{\Delta T} o(x)\delta x$$

(B) $$\int_0^{\Delta T} ix(x)\delta x \neq \int_0^{\Delta T} xo(x)\delta x$$

(C) $$\int_0^{2\Delta T} i(x)\delta x = \int_0^{2\Delta T} o(x)\delta x$$

(D) $$\int_0^{2\Delta T} xi(x)\delta x = \int_0^{2\Delta T} xo(x)\delta x$$

ASYNCHRONOUS SAMPLE RATE CONVERTER

REFERENCE TO RELATED APPLICATION

This application is a continuation of PCT Application No. PCT/US07/76048, filed 15 Aug. 2007 which claims the benefit of U.S. Provisional Patent Application No. 60/838,105, filed 15 Aug. 2006. These applications are incorporated herein by reference.

SUMMARY

One aspect of the technology is a method performing sample rate conversion of a sample series at an input rate to an output rate. The output rate is different from any integer multiple of the input rate. Performing the sample rate conversion includes at least correcting a version of the sample series with timing error information generated by a digital loop. Some embodiments correct amplitudes of the version of the sample series with the timing error information. The digital loop is locked to a first rate being a multiple of the input rate. The digital loop is clocked at a second rate being a multiple of the output rate. The second rate is different from any integer multiple of the first rate.

In various embodiments, the first rate is the multiple of the input rate, such that the multiple of the input rate is one or an integer greater than one. If one, then the version of the sample series is equal to the sample series at the input rate. If greater than one, the version of the sample series is an oversampled version of the sample series at the input rate.

In various embodiments, the second rate is the multiple of the output rate, such that the multiple of the output rate is one or some integer greater than one. If one, then the second rate is equal to the output rate.

Some embodiments generate the version of the sample series by clocking at the second rate. The version of the sample series includes timing errors due to clocking at the second rate rather than any integer multiple of the input rate.

Some embodiments generate, with arithmetic circuitry, modular overflows at an overflow rate adjusted to the first rate locking the digital loop. Each of the modular overflows indicates generation by the arithmetic circuitry of timing error information between the first rate and the second rate. A ripple carry adder is an example of such arithmetic circuitry. Other examples include other addition circuitry, as well as subtraction circuitry. Further examples are a parallel lookahead carry, and a one-cycle look up table. The arithmetic circuitry should generate a finite ordered set of output states. The overflow, or output that is not monotonic with respect to the ordering of the finite ordered set, is adjusted to occur with the same frequency as the first rate (being a multiple of the samples series input rate) when assessed over a period of time substantially longer than the time interval associated with the second rate (being a multiple of the samples series output rate). Having achieved this equality (of frequency over this relatively long interval), the state variables of the arithmetic circuitry at the cycle of overflow are encoding the timing error of the first rate relative to the second rate.

In some embodiments, the sample series at the input rate is from an S/PDIF (Sony/Philips Digital Interface Format) signal. In such embodiments, the input rate is the word clock of the S/PDIF signal, and the elements of the sample series are the parallelized data extracted from the S/PDIF serial data stream. Commonly, the SPDIF signal itself is a bi-phase encoded serial data transmission protocol, and the data encoded within it, if first bi-phase are decoded, made parallel, and then provided to embodiments at the rate of the embedded word clock of the SPIDF signal.

Various embodiments have one or more of various performance characteristics, as follows. The sample rate conversion has a dynamic range limited primarily by input quantization noise. The sample rate conversion has a dynamic range limited primarily by input quantization noise, image rejection of an oversampling finite impulse response filter, and image rejection of a downsampling finite impulse response filter. The sample rate conversion has a maximum downsampling ratio limited primarily by the output rate. The sample rate conversion has a maximum oversampling ratio limited primarily by a rate limitation characterizing logic synthesis of the circuit.

Another aspect of the technology is a circuit performing sample rate conversion of a sample series at an input rate to an output rate. The output rate is different from any integer multiple of the input rate. The circuit includes a digital loop locked to a first rate being a multiple of the input rate. The digital loop is clocked at a second rate being a multiple of the output rate. The second rate is different from any integer multiple of the first rate. The digital loop is formed by frequency detection and low pass filter circuitry, and variable oscillator circuitry. The digital loop generates timing error information. The circuit also includes circuitry correcting the version of the sample series with the timing error information. An example of frequency detection in the digital loop is average frequency, or long term frequency, which is equivalent to an average phase error of zero such that phase detection is an example of frequency detection.

Various embodiments include circuitry performing the methods as described, such as circuitry generating the oversampled version of the sample series by clocking at the second rate (the oversampled version including timing errors due to clocking at the second rate rather than any integer multiple of the input rate), circuitry correcting amplitudes of the oversampled version of the sample series with the timing error information.

In various embodiments, the digital loop generates timing error information between the input rate and the second rate, or timing error information between the first rate and the second rate.

In some embodiments, the variable oscillator circuitry includes finite modulus arithmetic circuitry.

In some embodiments, the variable oscillator circuitry includes carry adder circuitry including more significant bit circuitry and less significant bit circuitry coupled to the more significant bit circuitry. The less significant bit circuitry generates an overflow. The overflow indicates generation by the carry adder circuitry of timing error information between the input rate and the second rate, or between the first rate and the second rate.

Some embodiments further comprise an input integrated with the circuit. The input receives the sample series at the input rate from an S/PDIF (Sony/Philips Digital Interface Format) signal.

Another aspect is a computer program implementing an algorithms performing technology.

BRIEF DESCRIPTION OF THE DRAWINGS

FIGS. 1 and 2A-2K illustrate sample input signals and corresponding sample points.

FIG. 21 shows formulas for a correction in amplitude based on timing error information

DETAILED DESCRIPTION

Figure 1:
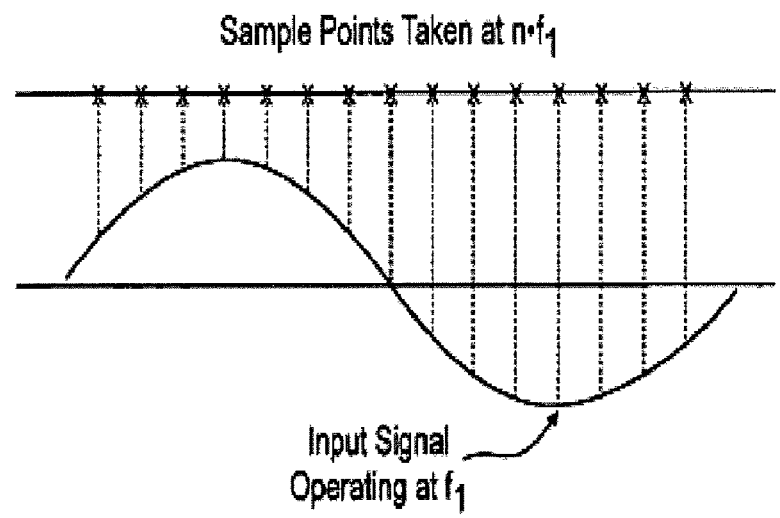

In determining error in a system, it is useful to keep a constant frequency.

The technology is directed to a new method of ASRC where there is no need for the analog PLL to generate an over-sampled input clock for the ASRC to lock on to. By using a circuit according to the technology, it is possible to estimate where the over sampled input clock would have been without actually generating it at all.

Utilizing the technology, there is no need to have an analog phase locked loop (PLL) to get information where an oversampled input data would be in relation to the click down used to sample the asynchronous input. The technology can be used in an analog PLL to create a multiple of the input sample rate and to convert it on the analog PLL output.

A circuit is provided to correct a sample rate by way of time domain interpolation having a first circuit loop having an up/down counter configured to receive an input signal and a feedback signal and an adder configured to receive the output signal from the up/down counter and to output a carry output as the feedback signal to the up/down counter and a second circuit loop configured to transmit a sum output from the adder to a modulator and to feed back an output signal from the modulator to an input of the adder.

An analog signal is a continuously variable quantity; it has a value at all times and has amplitude that is continuous. A digital approximation to an analog signal is conventionally made by generating a sequence of quantized number (numbers with a finite resolution) each the closest approximation to the analog quantity at regular intervals in time. For example, the digitization of audio signals by a CD player is accomplished by taking samples of so-called "16 bit resolution" at a regular rate of 44.1 Khz. "16 bit resolution" implies that the digital representation of the amplitude is over 16 binary bits and so accurate to about 1/65536 or approximately 16 ppm (parts per million). Another example is the digital audio that is reordered on a DVD disk. In this case the samples of amplitude may be resolved to 24 bits or about 0.06 ppm and the regular rate of taking these samples is at 48 Khz. Therefore, in the audio consumer applications we have at least two different sample rates (44.1 khz and 48 khz) and two different amplitude resolutions (16 and 24 bits) commonly used. FIG. 1A shows an example: here SIGNAL1 is sampled at 44.1 khz and results in the sequence of points marked by the "x". SIGNAL 2 is sampled at a higher rate (48 khz) and results in the sequence of points marked by "o".

The existence of two sampling rates within a system can be inconvenient: consider the case where a stream of digital audio data is arriving from a DVD source at 48 khz and a second stream at 44.1 khz is arriving from an ADC and a microphone source (this situation occurs when a "karaoke" player is using a DVD as a backing instrumental and the ADC is encoding the singer). How shall these two signals be mixed and output through the same audio output device? This is a problem because the input samples are arriving at different times—if the 48 khz source is used to run the digital signal processor (or, more precisely, if the DSP is configured to operate on samples at 48 khz) the samples of the 44.1 khz signal arrive in between the 48 khz samples—they must be delayed or otherwise approximated into the regular rate of the 48 khz in order to processed together. This is the "asynchronous sample rate" conversion problem and this disclosure teaches how samples of a signal arriving asynchronously with relation to some chosen clock can be approximated as a sample at that clock: the asynchronous samples are converted to synchronous samples in a given clock domain that nevertheless accurately represent the signal as it was sampled in the original (now asynchronous relative to the new clock) domain.

In this technology the chosen clock can be at a rate substantially greater than the input sample rate. FIG. 1B shows how a sequence of samples at 44.1 khz may be approximated into a much higher clock rate be performing a "zero order hold" function.

Figure 2A:
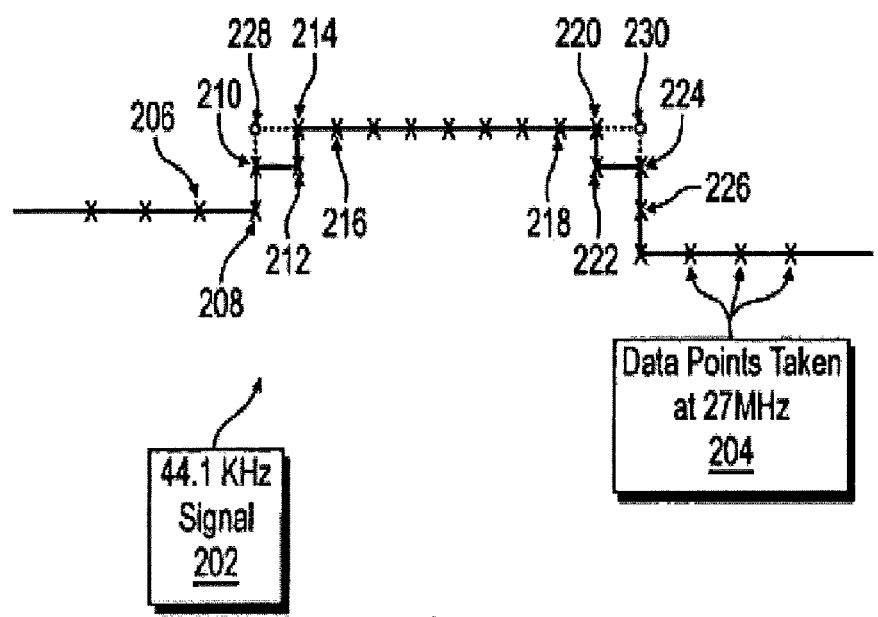

A "zero order hold" function is simply the repetition of the last sample that was seen by the higher speed clock. Note that in FIG. 1B the samples at 44.1 khz do not in general fall at the same time as any of the samples at the higher clock rate. The higher clock rate samples are repetitions of the sample last seen in the 44.1 khz domain. Therefore there is an error: as shown in FIG. 2D—the input sample changed slightly before the first changed sample in the higher clock domain.

Figure 1A:
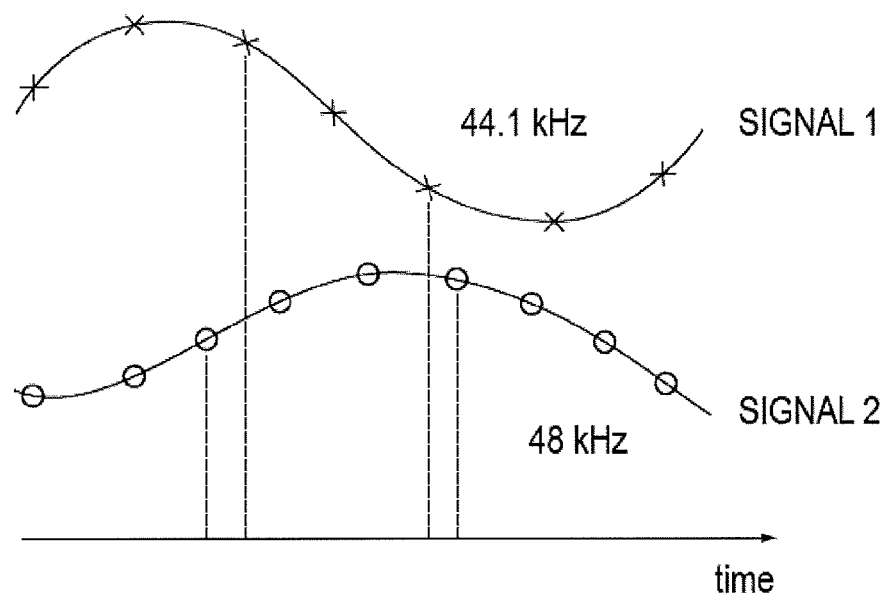
FIG. 1A illustrates the "asynchronous sample rate" conversion problem.
Figure 1B:
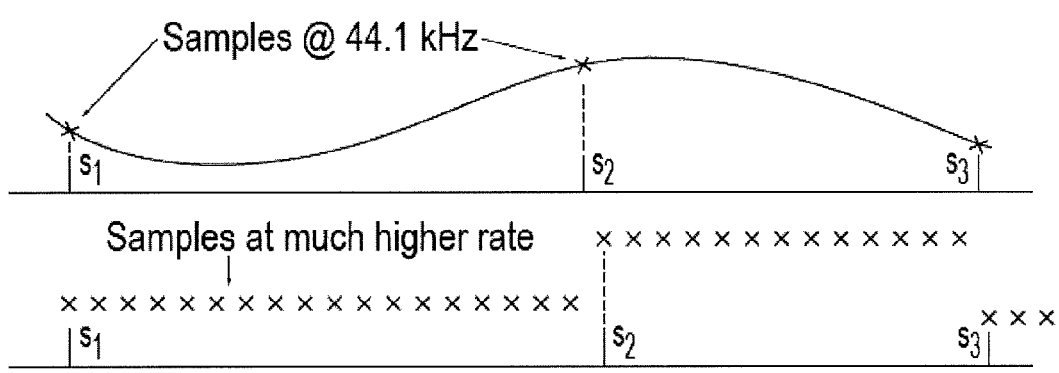
FIG. 1B illustrates the "zero order hold" function.

Referring to FIG. 1, a sample analog input signal operating at a frequency "f" is illustrated. In common practice, samples of the signal are taken at sample points, where the number of samples, n, determines the accuracy of the sample. The higher the number of samples, the more accurate reading of the analog signal can be taken. Thus, the frequency of samples taken is much higher than the frequency of the incoming signal. For example, referring to FIG. 2A, if the incoming signal 202 was operating at 44.1 kHz, the data sample points 204 may be taken at 27 MHz.

Errors, however, occur when trying to predict the exact value of a signal at a point. The latency in a circuit that samples the data can cause errors in reading the signal. Sample point 206, for example, is taken in series with previous samples. Sample 208, however, is at a transition point, where the next sample, 210 is read at the half way point, then sample 212 is read subsequently, followed by sample points 214 and 216. Continuing, sample point 218 is taken, then sample point 220 is at another transition point. Conventional circuits read point 222, followed by 224 and 226. The actual points from the ideal, however, are corner points 228 and 230. Again, the latency in the circuitry causes artifacts such as these to occur, and for signals to be read in the midst of errors. In conventional systems, an input system would over sample the input to pinpoint f(in), input frequency. This method, however, is inaccurate, and requires expensive circuitry to take more accurate samples.

Referring to FIG. 2B, an illustration of input points and output clock points are compared. As can be seen, the output clock points occur after the corresponding input points. Thus, they are at different frequencies. Referring to FIG. 2C, an illustration of a digitized signal is shown, where the x's correspond to the actual input at the input clock. The o's correspond to the correct output clock points. Ideally, the o's will correspond to the output clock signal points. In conventional systems that use synchronous clocks, this is not possible, and signal artifacts result.

Accordingly, there exists a need in the art for a system and method for more accurate sampling of signals, correcting for common artifacts. As will be seen, the technology accomplishes this in an elegant manner.

The technology is directed to a signal processing element for performing asynchronous sample rate correction by time domain interpolation. In operation, a digital signal is represented as a stream of digital numbers separated by a fixed and relatively large time interval. This signal is received as an input and processed to generate an output stream of digital numbers separated by a different and relatively shorter time interval. This process operates without introducing artifacts or errors into the newly created signal stream, despite the fact that the time interval between the input data stream and the output data stream is different and may not have any common factors in the respective frequencies.

According to the technology, most samples of the output are simple replicas of the input sample. However, upon detection of a change in the input signal, the output sample is, for one such sample, set to an intermediate value between the old value of input and the new value of output. After generation of this single intermediate sample, the output again replicates what is now the new input sample. Thus, correction of timing and sampling error is accomplished by the generation of this single intermediate sample that occurs each time the input signal, operating at a lower rate, is detected to have changed.

An interpolated data point will be observed to have been inserted into the output data stream to provide the correction. The value of the intermediate sample is determined from the relative timing of the input sample point between the two output sample points that surround the input sample. The determination of the precise position of the input sample point between the output sample points is determined by logic operating wholly at the output sampling rate. That is, despite the fact that no logic operates any faster that the output sample rate, the technology provides a means to accurately determine the input sample time.

Generally, the technology is directed to a system and method that has three basic characteristics: a faster output clock, determining the point where the input clock changed and performing a time domain interpolation. The purpose is to account for the differences in the input and output data.

Figure 2E:
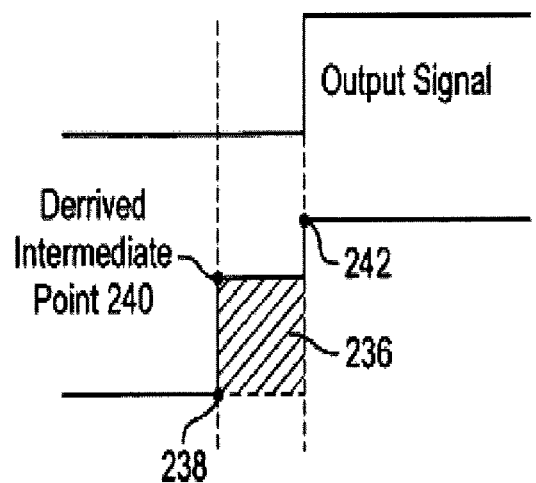

In one embodiment, a faster output clock better captures the input signal points. In practice, the input clock can fall between the output clocks, and each input clock generates a new sample point. It is possible to simply sample the input upon each cycle of the output clock. However, it is still possible that the retrieved input clock signal value may be missed. Thus, from a graphical view, referring to FIG. 2D, the shaded area 234 is the portion of the input signal that was missed. Thus, the system would need to wait for the next clock cycle. This would be the case in conventional systems. In contrast, according to the technology, this first pass is ignored, and the first cycle would be missed. In the next step, as illustrated in 2E, and intermediate point is generated, which occurs between the high point and low point of the input signal. Thus, point 238 is the prior point from the input signal, point 240 is the derived intermediate point, and point 242 is the new input point. According to the technology, the area 236 shown in FIG. 2E of the new signal has the derived intermediate value. The manner in which this value is derived is discussed further below.

Therefore, if we just use the input sample seen when the input clock is present, an error will occur. The input will not have changed just after the last clock cycle. The shaded area of input is missed. However, the output can be delayed by any number of clock cycles. This will not distort the output. Therefore, the input can be sampled and a delay can occur by one or more clock cycles, such as the example above. This allows a system to insert a point between the old value and the new value. Such a value is inserted at a point such that the area is the same. The output only ever changes on the clock cycle. A system can compensate for the fact that the input did not change in clock by using the intermediate point. In the end result, the areas, such as areas 234 and 236 above, remain the same. This is accomplished in one embodiment by use of a phase locked loop such as that illustrated in FIG. 3.

Figure 3:
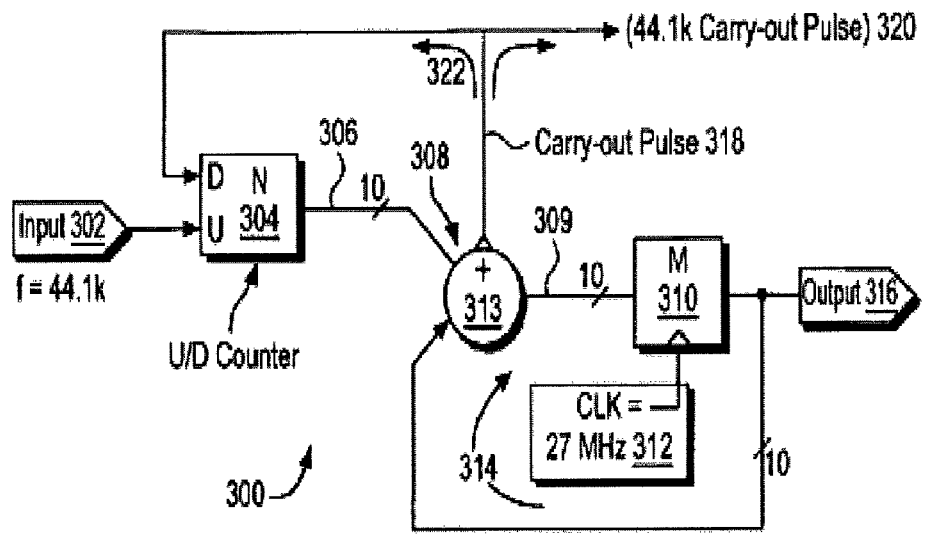
FIG. 3 illustrates a digital phase locked loop.

Referring to FIG. 3, one embodiment of the technology is illustrated that provides a system configured to pinpoint the frequency by time domain interpolation. A phase locked loop 300 is provided that receives an input signal 302 received at an up/down (U/D) counter control 304 that synchronizes the cycles of an input signal. The up/down counter outputs a signal 306, 10 bits in this particular example, to a modulo accumulator 308. The accumulator 308 forms part of two feedback loops in which the circuit operates. The accumulator outputs a signal 309, again 10 bits in this example, to a modulator 310, which operates according to a clock 312, 27 MHz in this example, and produces a feedback signal that is transmitted through a feedback loop 314, and a corresponding output signal 316. The modulo accumulator outputs a signal 320, which is a carry-out pulse that is output as a 44.1 kHz carry-out signal, and feed back through a feedback loop 322 to the down input of the up/down counter 304. The input signal 302 is fed into the up input of the up/down counter 304.

In operation, the input signal operating at a first frequency, for example 44.1 kHz, is input into the up input of the up/down counter. The output of the up/down counter is transmitted to one input of an adder. The output of the modulo accumulator is input into a modulator, clocked at a second frequency, 27 MHz for example, and the output of the modulator produces a first output "M" of the circuit, and is also fed back as the second input of the adder. The adder has a carry output that is fed back to the "down" input of the up/down counter. The carry output resets the up/down counter upon an overflow from the adder, resetting the front edge of the output signal, the second output. The adder adds the output, a 10 bit output for example, of the counter to the 10 bit output signal from "M". Thus, the point of the sample rate is determined by the formula $x_0 = x_n + (M/N)(x_{N+1} - x_N)$; where M/N is the error in timing.

The determination of the input sample time is made as follows. First, a modulo accumulator 308 is configured to add, at the output clock rate 312, an input 313 to a running total. The accumulator 308 may be configured as a digital adder and register operating with a finite integer width, or other known additive device configured to accumulate an increasing value. The running total will ultimately overflow to generate an output pulse 320, as the adder is of finite width and will eventually max out and overflow. According to the technology, the frequency rate of the overflows 320 from the modulo accumulator 308 is compared to the rate of arrival of input samples 305. If the rate of arrival of input samples exceeds the rate of overflows of the accumulator, the input to the adder 313, which is the amount that is added each cycle of the output, is increased. Conversely, if the rate of arrive of input samples is less than the rate of overflows from the counter, the input to the adder is decreased. Therefore, a control loop 314 exists, where the input to the adder will settle to a value such that the rates are equal.

Figure 4:
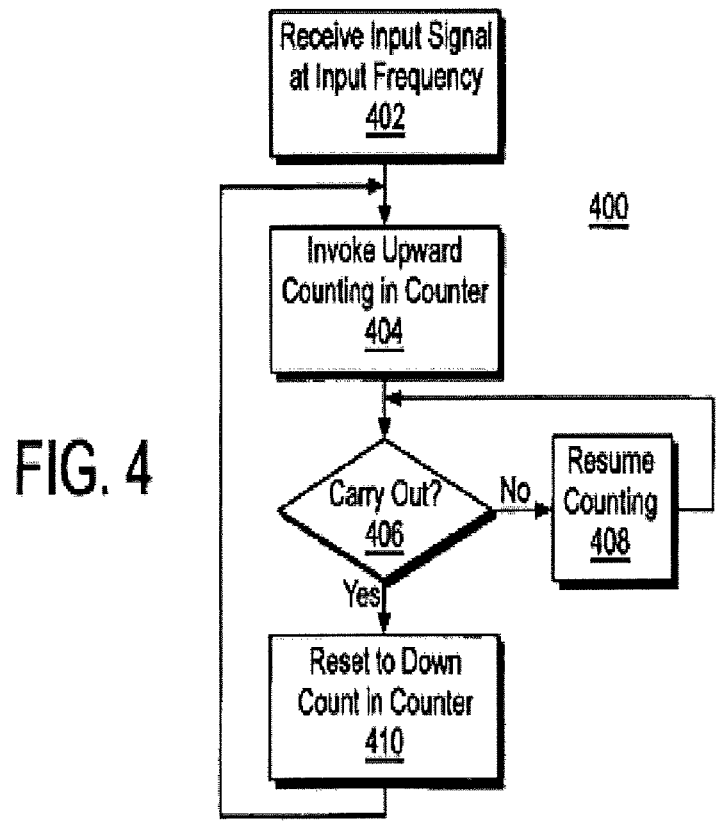
FIG. 4 is a flow chart illustrating method of a digital loop locking to a frequency.

Referring to FIG. 4, a flow chart 400 is illustrated that generally describes the operation of the circuit 300. An input signal operating at an input frequency is received at step 402. The upward counting is invoked in the up/down counter in step 404. In step 406, it is determined whether there is a carry-out pulse. If there is no carry out, the process resumes counting in step 408. Once, a carry out occurs, the process moves to step 410 where the up/down counter is reset to a down count, the baseline value B in FIG. 5.

Initially the number in the counter is zero (318. FIG. 3 is the counter output), so the adder never overflows. The adder is adding zero. However, eventually an input signal increments the counter. Now, the adder must eventually overflow. Moreover, the counter will only reach equilibrium when the rate of the overflows of the adder equals the rate of the input clocks. For example, if the input clock rate is 48 KHZ, the output clock rate is 1 MHz and the bus width is N=20, then the counter with stop moving when the number is the following:

$44e^3/1E^6 \times 220=46137$

This is because, at this number, the adder overflow rate is $46137/2^{20} \times 1$ mhz=44 $e^3$. Therefore, there are just as many 'down counts' as 'up counts' to the counter.

Figure 2F:
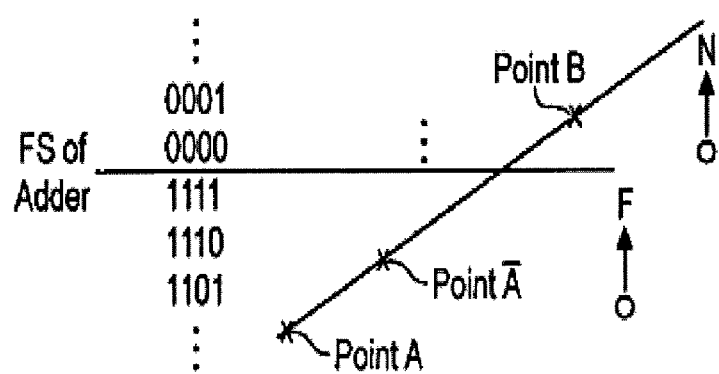

It is observed that when the system described is locked, when the number in the counter has substantially settled, the number in the register at the time of arrival of the input clock represents the error in position of the input. More particularly, when a carry out occurs, the system looks at the number in the register. It just exceeded full scale. And, that is why there was an overflow. Referring to FIG. 2F, The number (A), the counter number, was just added to the number in the register. Therefore, the number now in the register is some number less than A. FIG. 2F illustrates the number in the register, FS is shown. Each time it adds (A) to the total, at some point, it exceeds FS by B, B must be less than A. In this embodiment, the number in the counter is N, and the amount by which the register overflows is M.

Figure 2G:
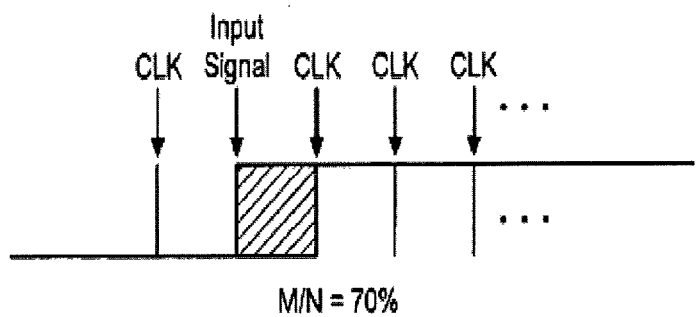
Figure 2H:
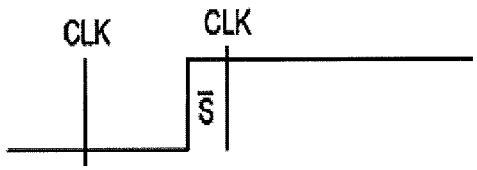
Figure 2I:
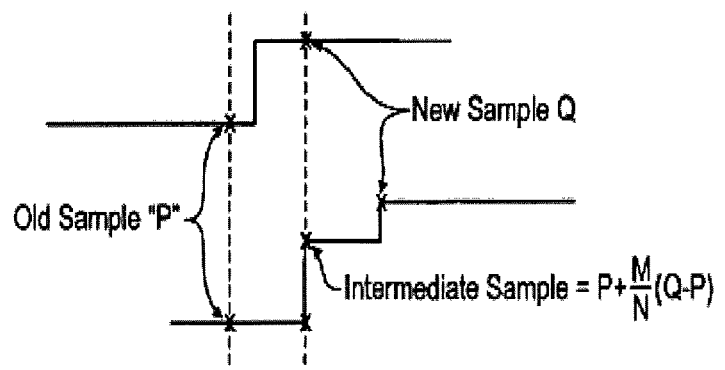

Referring to FIG. 2G, it is observed that the quantity of M/N is the error in the sample time. This is further shown in FIG. 2H. Therefore, this is where the system can know where the input clock point was located, it looks at M/N in the loop discussed above and illustrated in FIG. 3. Referring to FIG. 21, It is illustrated that the intermediate sample is derived by the old sample P and the old sample Q. The intermediate sample is S=P+M/N(Q−P). Again, the system can now know where the input clock position was and can derive the intermediate point S from those values. The system inserts a single sample into the output stream. It is intermediate between the last sample of the input and the next sample of the input. It is calculated by locking the digital look to the input and the output clock. 'M' is the amount by which the loop register overflows and 'N' is the number in the loop counter. The intermediate sample is S=P+M/N(Q−P).

The technology exploits the observation that the position of the input sample may be determined by the residual number preset in the accumulator just after overflow. The amount at which it overflows is proportional to the position of the signal in time with respect to the clock. Specifically, upon detection of the overflow in the modulo accumulator, the residue, which is the number remaining in the finite width accumulator, is recognized to be proportional to the relative position of the input sample rate between samples at the output rate. Thus, the position is determined and the intermediate sample may be generated using this determination without any logic operating any faster than the output sample rate clock.

Figure 5:
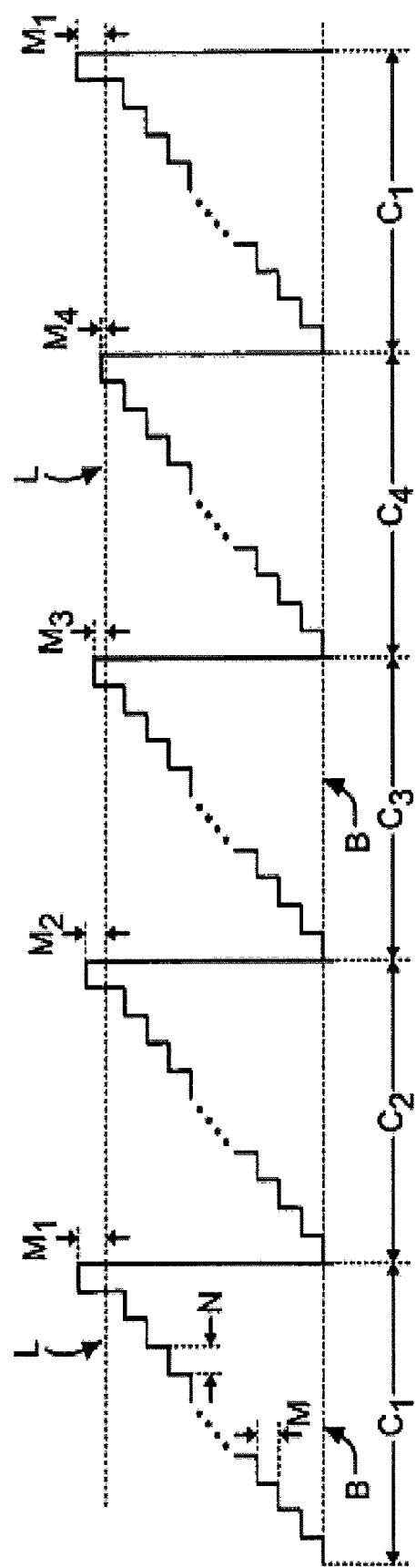
FIG. 5 is a timing diagram of a compensated signal.

Referring to FIG. 5, a timing diagram of a compensated signal is illustrated. In operation, the over cycle of the process is repetitive, C1-C4 in this example, which repeats every 4 cycles. In the particular example illustrated, there are four channels. There can be more or less channels as particular applications may be desired. The duration of each channel is determined by dividing the modulo adder clock frequency 312 by the signal frequency, as in this example: 27 MHz/44.1 kHz=612.25. Thus, each of C1-C4 is substantially equal. The accumulator accumulates in increments the size M, over a time span N at each step. Once the modulo accumulator overflows in an amount over the maximum limit L, the circuit resets back to the minimum baseline B. According to the technology, the amount of overflow of each stage, M1-M4, is used to determine a more accurate point of transition of the incoming signal. It is observed that this value changes, and may even decrease over time, as in the example illustrated in FIG. 5. In practice, the error decreases by setting the sample points every 612.25 ms.

Figure 2J:
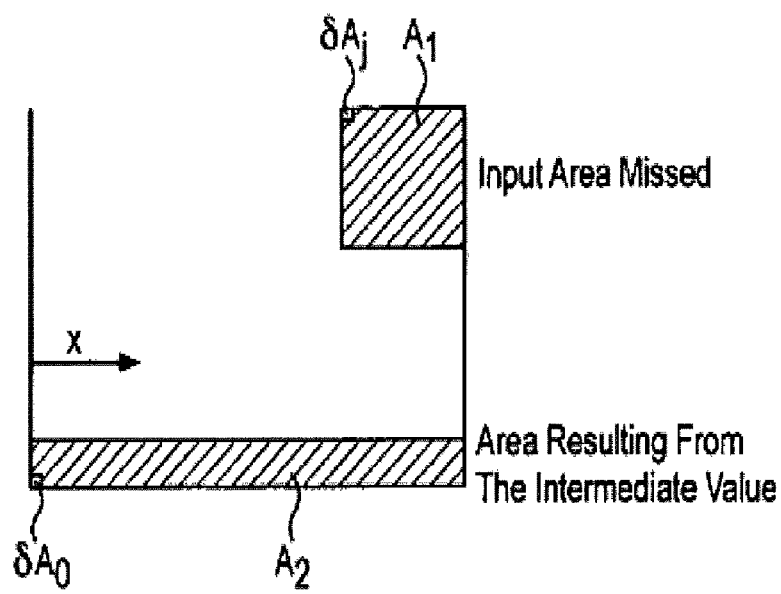
Figure 2K:
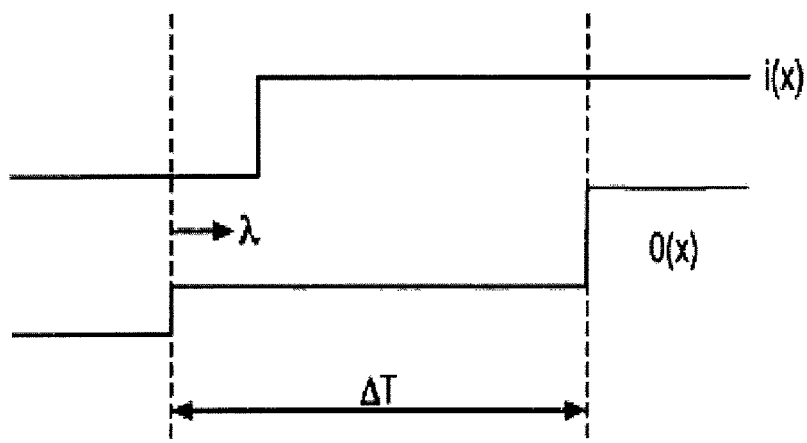
Figure 6:
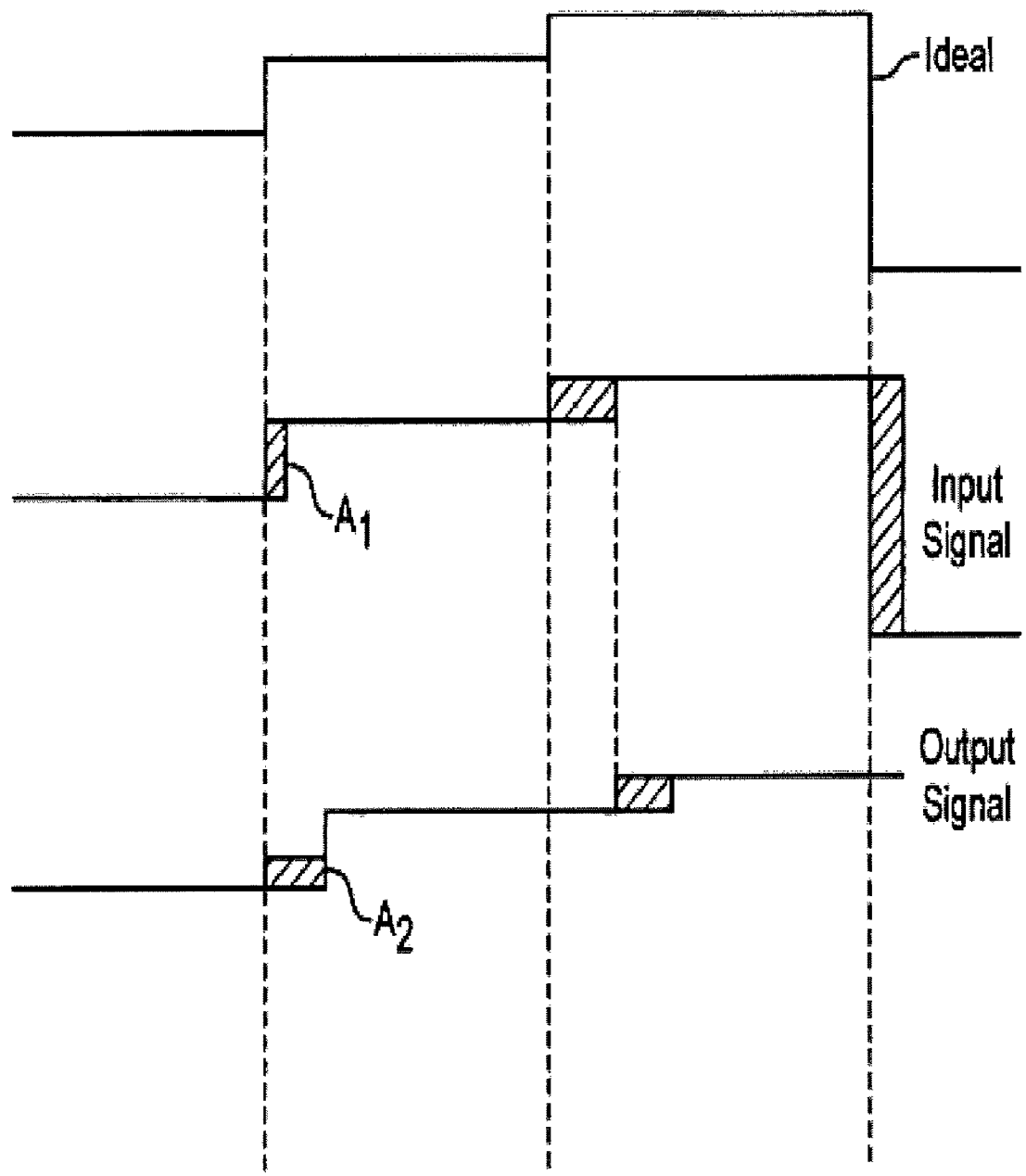
FIG. 6 illustrates a graph illustrating error factors.

Area defines area of compensation. More particularly, referring to FIG. 6, $A_1$ is the area of the input, and $A_2$ is the area about the intermediate point. Each area is made up of small area samples, and the sum of the areas are the same. Referring to FIG. 2J, the input signal area is made up of the sum of $\delta A_i$'s from the input, and the output signal area is made up of $\delta A_i$'s from the sum of from the output signal. However, the centers of gravity of the areas are not the same, which is evident from the areas samples shown in FIG. 2J. Referring to FIG. 2K, a mathematical explanation can be derived. If i(x) is the input signal, and x is the distance from the start of the interval, and o(x) is the output signal. The intervals are arranged to satisfy the equation of FIG. 21(A). The area under the curve is the same, however, follows the equation of FIG. 21(B). This expression is the center of gravity of the first moment of the function. They do not match in the separate areas. However, according to the technology, with two intermediate points, the first moment can be matched as in the equations of FIGS. 21(C), (D).

Figure 7:
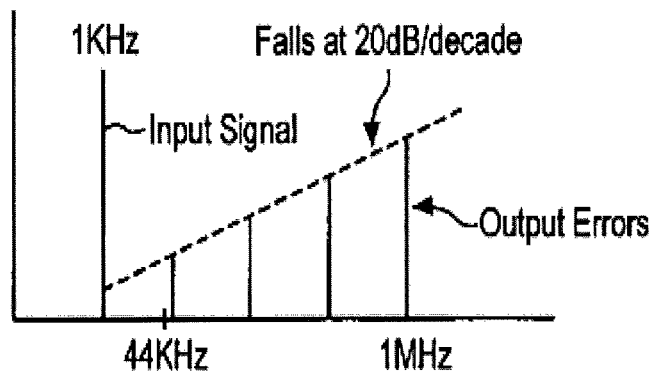
FIG. 7 is a graph showing the error frequency with a 20 dB/decade slope.
Figure 8:
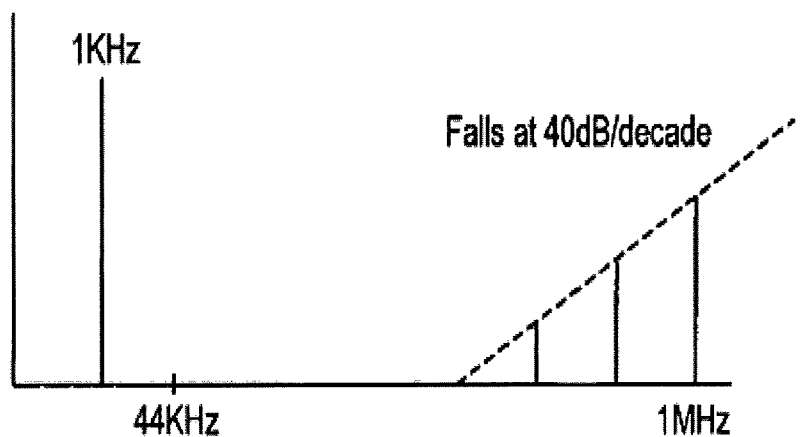
FIG. 8 is a graph showing the error frequency with a 40 dB/decade slope.

Therefore, each additional moment matched increases the order of the approximation made. In the frequency domain, referring to FIG. 7, if the areas are matched, the error frequency falls at 20 dB/decade. Furthermore, referring to FIG. 8, if the moments of each area are matched, the error frequency falls at 40 dB/decade.

Therefore, the technology provides a system that can have an $n^{th}$ order tome domain asynchronous signal rage converter (ASRC) interpolator. This is accomplished by using a digital locked loop to find the actual input change. The arbitrary high order frequency of error is cancelled by using intermediate samples.

The following is another explanation of the technology. Digital data streams are replacing analog signals in most applications. The digital data stream is a series of quantized samples at a specific clock rate. Many systems, particularly audio systems, are required to handle data at different data rates: a common example is audio data at 44.1 k samples per second from some equipment, and 48 k samples per second in other equipment. If data rates can be changed (if, for example, a stream of data at 44.1 k s/s can be converted to 48 ks/s) the same post processing system at a fixed sample rate can be used. The problem of sample rate conversion between unrelated clocks is solved by use of an Asynchronous Sample Rate Converter (ASRC or simply SRC).

Figure 9:
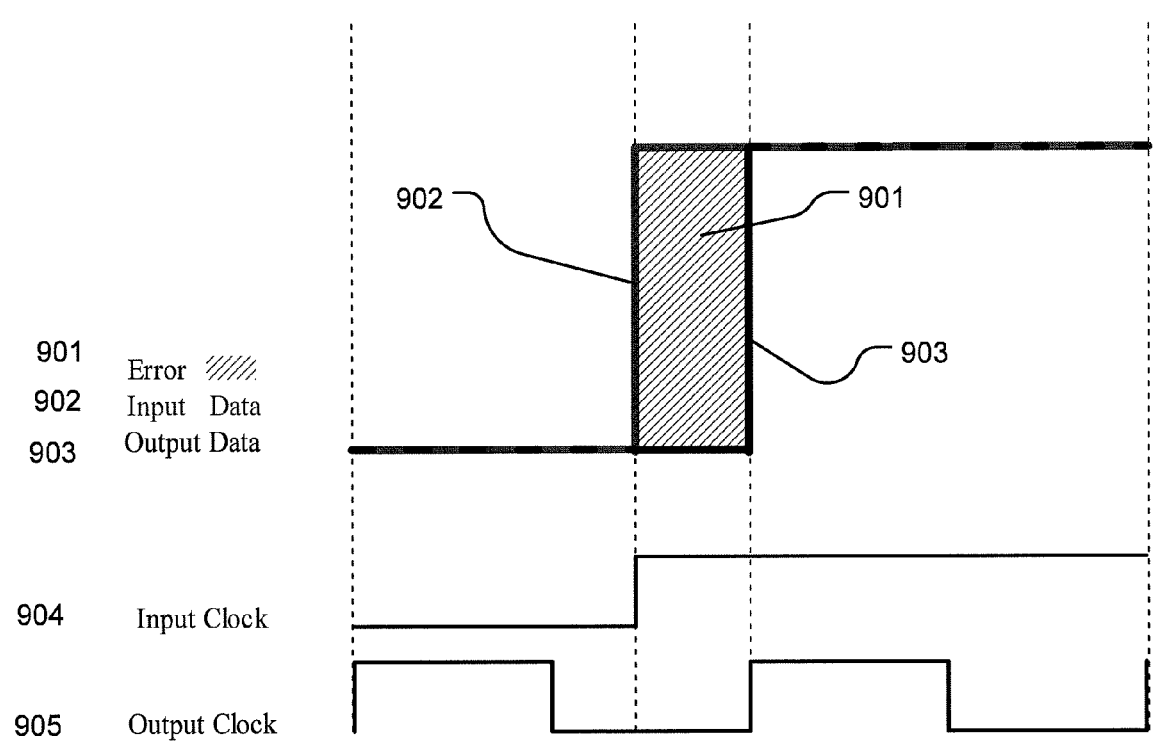
FIG. 9 is a graph illustrating error introduced by resampling.

The SRC described here operates by over sampling an asynchronous input stream into a multiple of the output clock domain and then sub sampling in the output clock domain. We will describe the operation of this SRC using a 44.1 k to 48 k example. Logic operating at a multiple of the output clock rate is used—in this example 256*48 k=12.288 Mhz. The input samples change at a rate not related to this clock, but we begin the process by sampling the input at 44.1 k into the 12.288 Mhz clock domain. This process of simply re-sampling the input data into the output clock introduces distortion because the timing of the samples is not preserved. This distortion is due to the error made when the input changes—at that point the output has not preserved the precise time of the data change. This error in time at a rate of 44.1 khz/12.288 Mhz. FIG. 9 shows the sample changing between the output clock and the error introduced. The shaded area 901 represents an error. In principle, if we could find this error we could make some compensation to the output samples.

Figure 10:
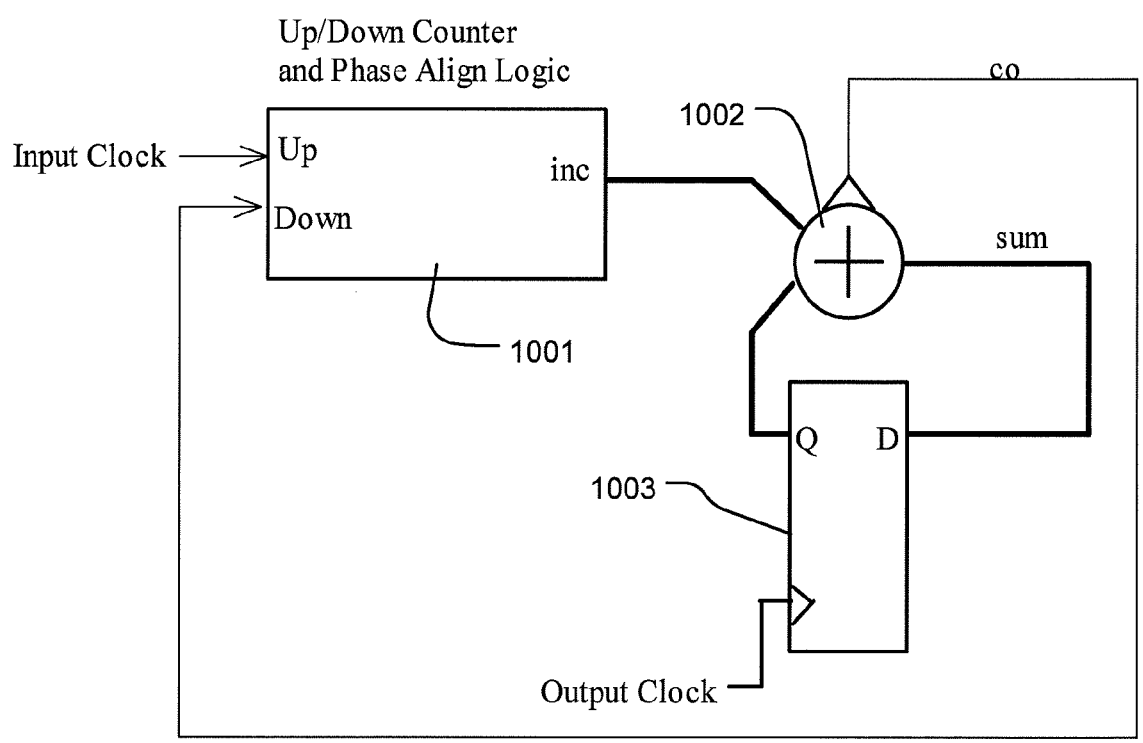
FIG. 10 shows a modulo arithmetic adder.

It is possible to find this error using logic operating at only the 12.288 Mhz rate. We find the precise point in time where the input sample has actually changed by building a digital PLL operating at 12.288 Mhz. This is done with a modulo arithmetic adder—an adder with a finite width, ignoring overflow—as shown in FIG. 10. The input quantity is adjusted until the rate of output overflow events is the same as the rate of input clocks. Note that the outputs of the digital loop are synchronous, i.e. in the 12.288 Mhz domain; the input rate is asynchronous but the average rate is adjusted to be the same by operation of the up/down counter. This will create a digital frequency locked loop. The overflow "co" of the adder is now frequency locked to the input clock in the 12.288 Mhz clock domain. We observe that if the contents of the adder "sum" output bus are examined at the time when overflow "co" occurs, this sum output is actually encoding the precise point where the asynchronous input change occurred. Specifically, if the quantity "m=sum/inc" is calculated where is "inc" is the contents of the up/down counter, then "m" is the ratio of input clock time lying within the 12.288 Mhz clock domain. For example, if m=¼, then the input asynchronous clock would have actually changed ¼ way between the two successive 12.288 Mhz clock points, and likewise, if m=½, then the input clock would of changed ½ way between the two 12.288 Mhz pulses. We have derived the precise point where the input sample has changed without any logic other than that operating at the multiple of the output clock rate to within accuracy proportional to the bus width used for the DPLL. We now have all the information we need to correct the output data stream.

The output sample is correct by considering the shaded area shown in FIG. 9. That area represents an error in the output data stream. The error can be corrected to an arbitrary order: performance of the conversion is related to the order of correction and also to the ratio of the input data rate to the output data rate.

Figure 11:
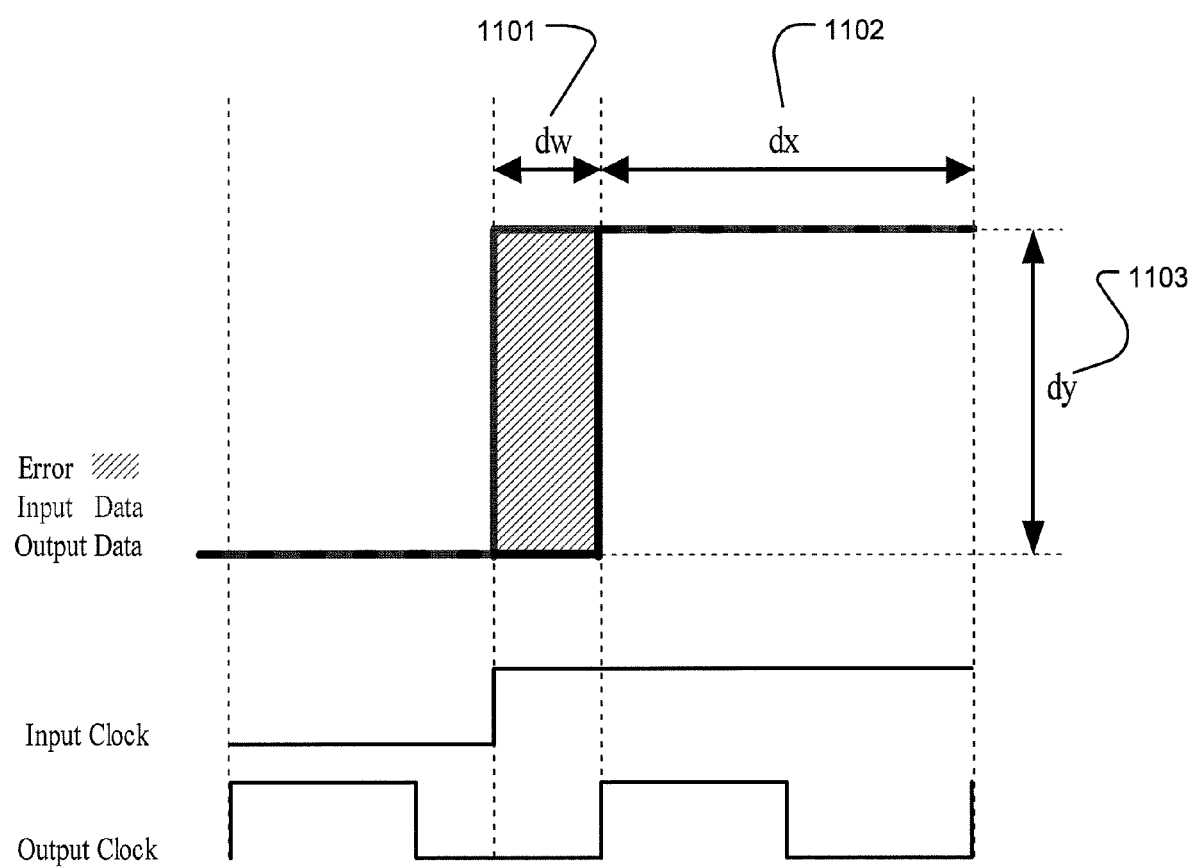
FIGS. 11 and 12 show a correction in amplitude based on timing error information.
Figure 12:
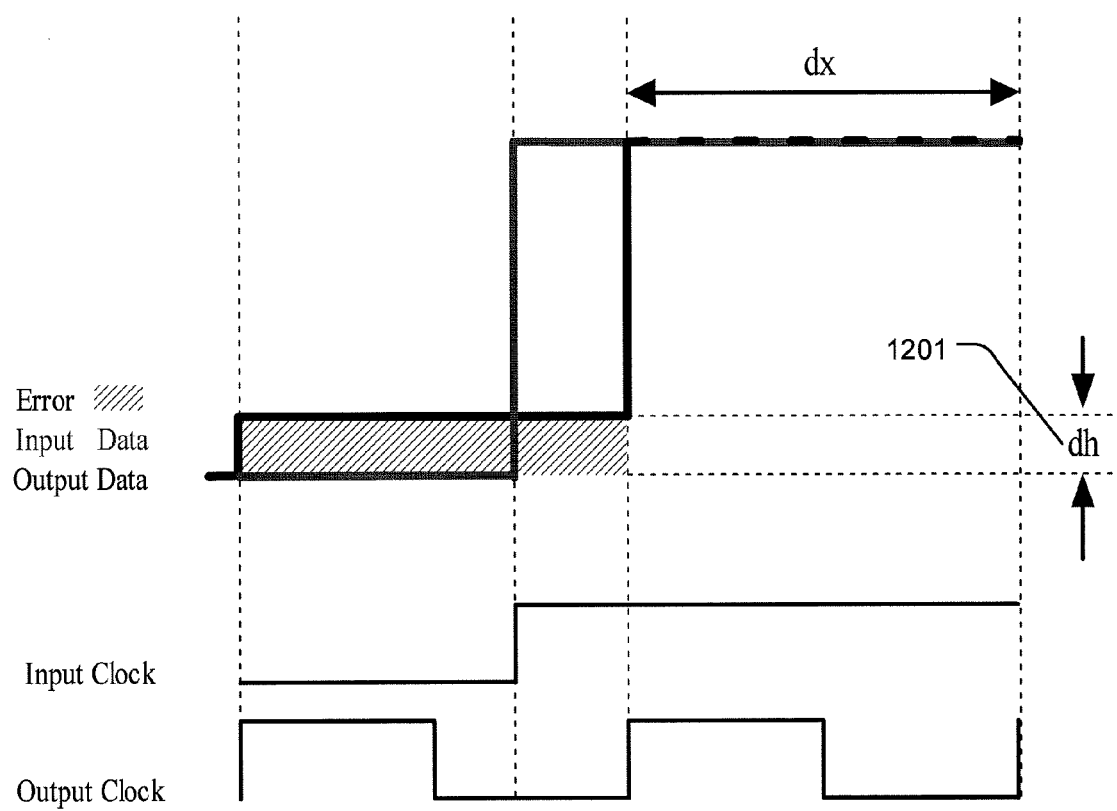

A first order or linear interpolation in the time domain is done as follows. The DPLL is used to calculate where the input data stream has changed relative to the output clock 12.288 Mhz. From this point, we can calculate the error in time, and then change the amplitude of the erroneous sample to give a first order correction. The correction is shown graphically in FIGS. 11 and 12. The error in time is converted to an error in amplitude that is matched to the first order. Referring to FIG. 11. "dy" represents the changing in amplitude of the input sample. "dx" refers to the period of the output clock, i.e. 1/12.288 Mhz. "dw" represents the time difference of when the asynchronous input changed, and when the output clock has seen the change. Referring to FIG. 12. "dh" is the amount to modify the sample so that the errors are matched to a $1^{st}$ order.

The gray area in FIG. 11 may be considered as a "weight", we must create the same "weight" in an amplitude error, shown as the gray area in FIG. 12. The calculation is:

$$dw \cdot dy = \text{error\_in\_time} = \text{error\_in\_amplitude} = dx \cdot dh$$

From the DPLL the value described as "m" represents "dw" in this equation, and since the DPLL is clocked at the 12.288 Mhz rate, the "dx" is equal to 1. The "dy" is easily calculated as the difference between the two input samples. From this information, a simple calculation can be done to determine the "dh" value, namely:

$$dh = m \cdot \text{input\_difference}$$

If the new input sample is changed to "dh" the error will be correct to the first order; by making the "weights" of the errors the same, we have made a $1^{st}$ order approximation to the ideal output stream in the 12.288 Mhz time domain. After this adjustment to this single transitory sample, we filter the data to the Nyquist output rate and sub-sample the data at the output rate, so completing the SRC conversion. We have used a single time domain interpolated point per input sample to complete this entire process.

Figure 13:
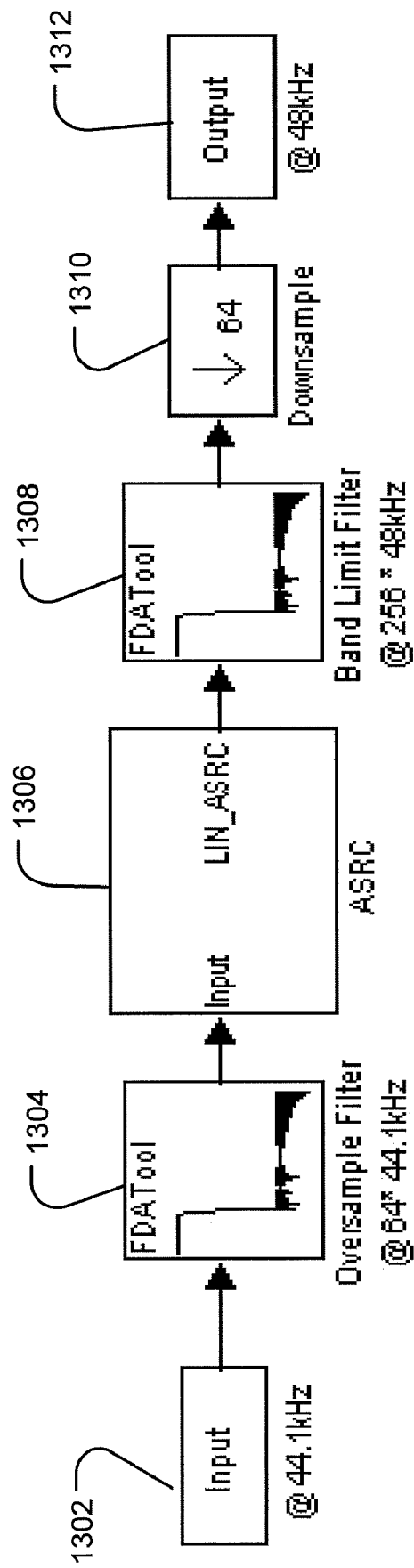
FIG. 13 shows a block diagram of an embodiment, with oversampling and downsampling.
Figure 17A:
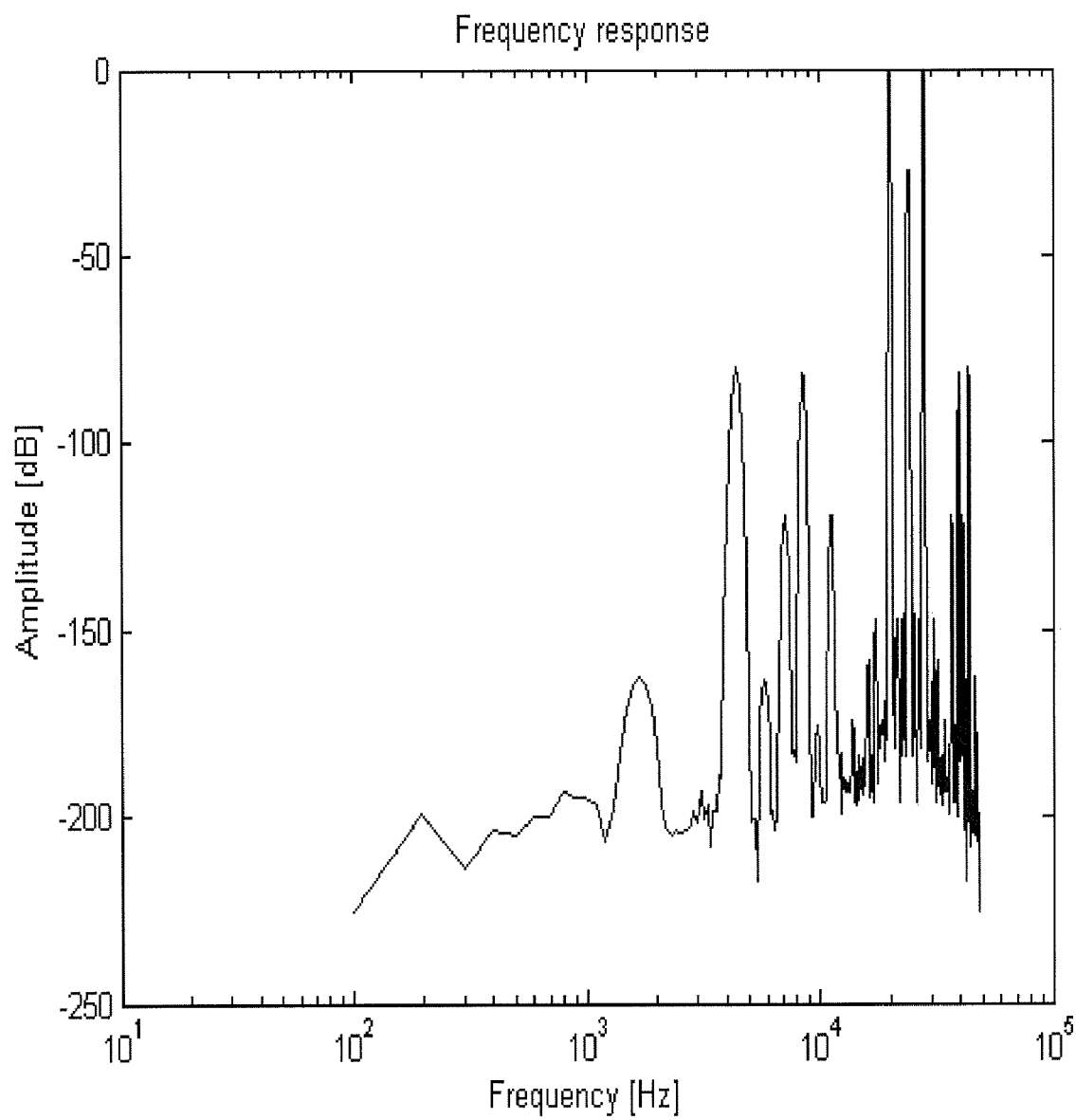
FIG. 17A is a graph of an RTL simulation of a circuit which does not use the digital loop that locks as described herein.
Figure 17B:
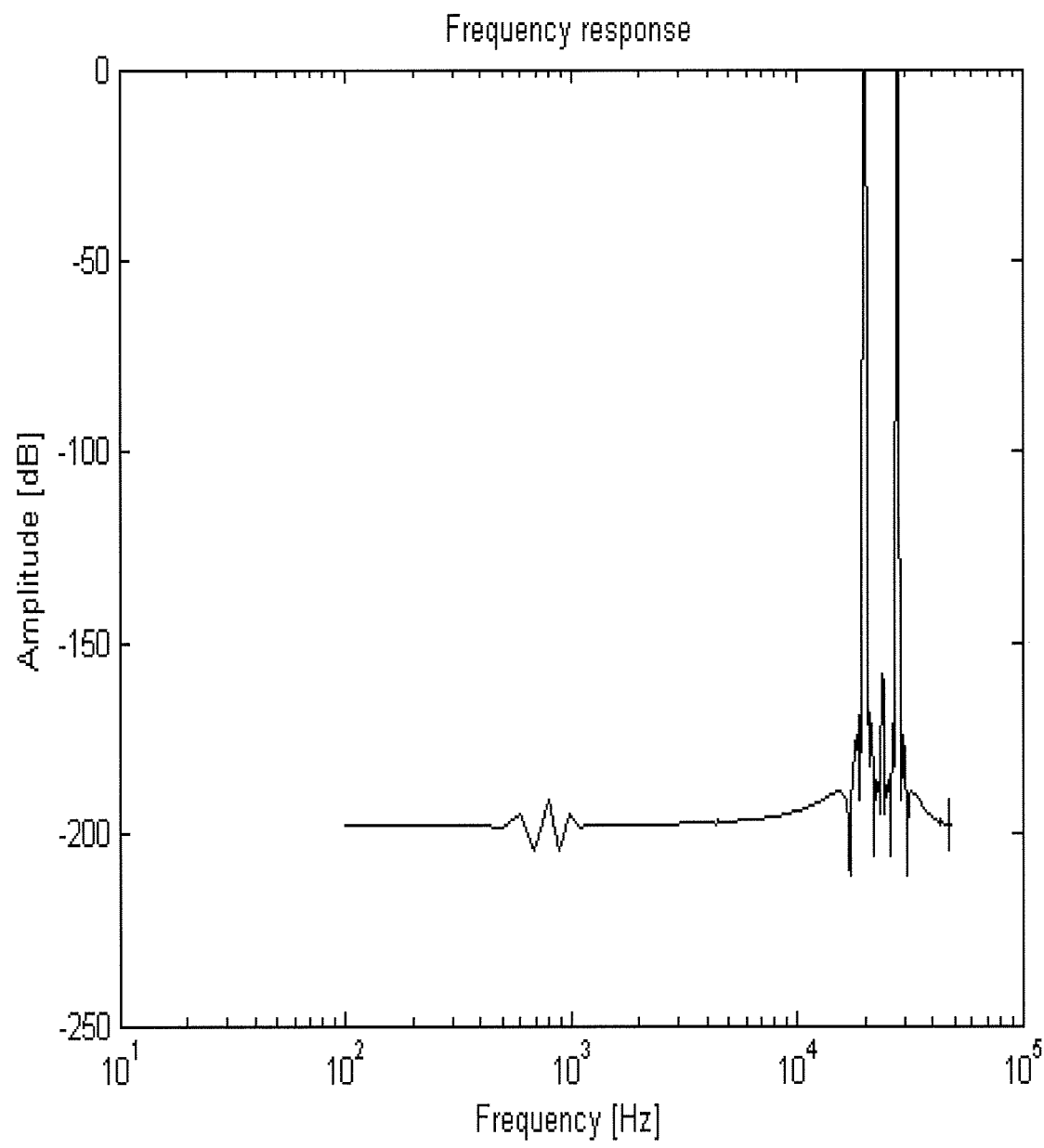
FIG. 17B is a graph of an RTL simulation of the circuit of FIG. 13.

By extending this idea to match the not only the "weights" but also the "moments" about a common point, the approximation may be increased to second or higher order. Extending to many orders is possible at the expense of increase complexity in calculating the interpolated points. Optimum performance occurs when the rate of input to output sampling rate is low, this can be achieved by first using a multiple of the input clock to over sample the input data stream before passing onto the SRC, although it is not necessary. Performance when converting a 44.1 kHz to 48 kHz tone is better than 180 dB if the input is over sampled by 64 times, (64*44.1 khz=2.8224 Mhz) and then passed into the SRC running at a rate of (256*48 khz=12.288 Mhz). FIG. 13 shows the block level diagram of the SRC and FIG. 17B shows the output of a RTL simulation running with 32 bit accuracy. The worst-case result (which occurs at the highest signal frequency, 20 kHz) is shown.

The following is another description of the technology, also called an ASRC with Virtual Up conversion of Input Signal.

In a previous ASRC it was found that if we had an input signal at 44.1 kHz and wanted to convert to 48 kHz. The performance was greatly improved if we could actually over sample the input data at 44.1 kHz up to some rate, say 64*44.1 kHz, and then convert that into an over sampled output rate at say 256*48 kHz and then decimate back down to the 48 kHz. To do this requires some filtering and clocking signals, but the results are tremendous. To show how well it works, see the example below. FIG. 17A shows the 44.1 kHz sample rate converted directly into 256*48 kHz and then decimated to 48 kHz with a $2^{nd}$ order ASRC.

FIG. 17B shows the exact same signal being converted, but this time over sampled to 64*44.1 kHz then converted into the 256*48 kHz domain, then decimated down to 48 kHz.

The great performance benefit of first over sampling the input data into a higher rate before running the ASRC can be seen by comparing FIGS. 17A and 17B, from oversampling the input signal before trying to convert the sample rate. FIG. 17A shows additional spikes that are errors caused by clock domain translation. The spikes in FIG. 17B area an at 20 kHz and 28 kHz, representing the input signal and the output sampling rate of 48 kHz—the input signal at 20 kHz.

A previous ASRC technology required the generation of 64*44.1 kHz via Analog PLL. Present embodiments include an ARSC with Virtual Up Conversion of Input Signal, removing the need for the Analog PLL to generate a over sample input clock for the ASRC to lock to. The circuit can estimate where the over sampled input clock would have been without actually generating it at all, hence "ASRC with Virtual Up Conversion of Input Signal". There is no actual input over sampled clock for the ASRC to lock to, however we can derive the timing of where is should have been and correct the output data stream to be as if we actually had that clock. FIG. 13 shows this technology of sample rate conversion.

The digital logic circuitry that creates the ASRC and all the filtering needed to over sample, then decimate, can now be done in the output clock domain! The ASRC now uses a digital PLL to lock to the 44.1 kHz but then creates the over sampled (64*44.1 kHz) clock pulses. Since these pulses are actually being generated by the 256*48 kHz clock, the timing of these pulses are incorrect. This new circuit will lock to the 44.1 kHz and create some phase information that actually tells the sample rate converter how far off each of the over sampled pulses are from the "Virtual" over sampled clock as if the digital PLL was actually locking to clock that is exactly 64*44.1 kHz generated by a Analog PLL.

Accordingly, this gets rid of the need to generate 64*44.1 kHz before going into the ASRC since it can actually figure out where the timing of this clock "would" have been. This means the chip is relatively easy to create, since there is only 1 clock domain in the entire sample rate converter.

This technology is possible due to the fact that the Digital PLL is now able to lock to some frequency (i.e. 44.1 kHz) and accurately create timing information that describes where the clock edge at some over sampled rate (i.e. 64*44.1 kHz) would actually be. This timing information is then passed onto the ASRC and the ASRC uses it to adjust the output data stream to correct for this timing error. Since we have the information of the relative timing of our "Virtual" over sampled clock without actually needing that clock, we can then use the OUTPUT clock domain to clock the input over sampling circuits that are supposed be on the over sampled INPUT clock domain, then use the ASRC to modify the data to correct for the mismatched timing.

Figure 14:
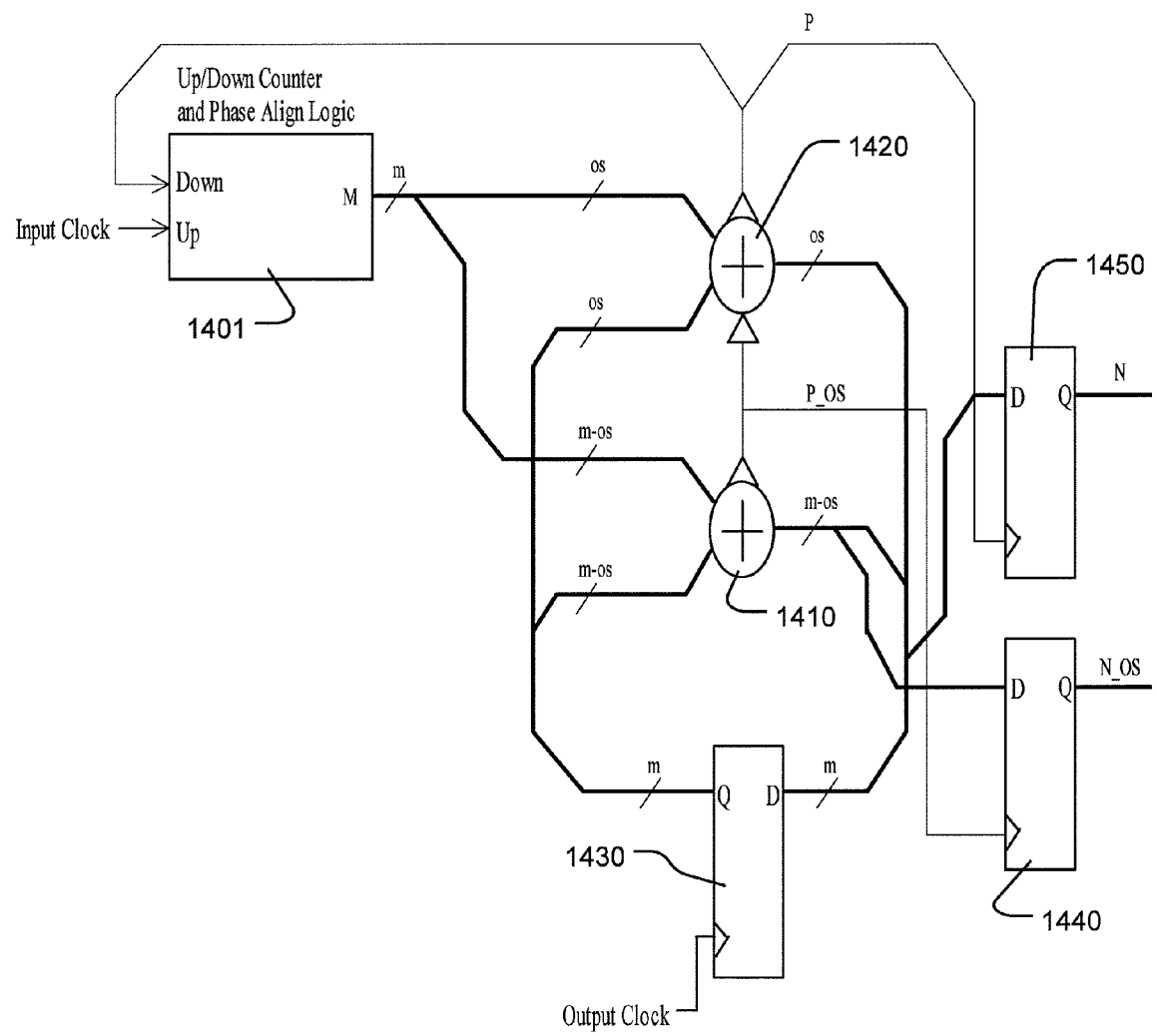
FIG. 14 shows a digital phase lock loop with different rates locking and clocking the loop that generates timing error information.

FIG. 14 shows how a Digital PLL can be made that could create the "Virtual" over sampled clock (labeled "P_OS") and also the timing information. (Which is derived from "M" and "N_OS".

The circuit in the FIG. 14 describes how to generate a DPLL with an output that is a multiple of the reference frequency (Input Clock). The data "N_OS" and "N" are extracted from the DPLL in order to recover some instantaneous phase information. In theory, any circuit that performs a DPLL function by generating an output that is phase aligned and can be any multiple of the reference frequency, or any fraction for that matter.

For example, any circuit that takes a reference frequency at any frequency, F1, and can generate a output frequency, X*F1, where X is some real number, and be phase aligned, (The rising or falling edges of the reference F1 and every X rising or falling edge of output X*F1 are "locked" meaning that they don't drift relative to one another over time) would be considered a DPLL. A DPLL is similar to a PLL in that there are only several blocks need for correct operation.

1. Phase detector
2. Integrator
3. VCO

The operation is as follows. The reference frequency input goes into a phase detector, and get compared with the output of the circuit, which is the VCO's output. The error is the difference between the 2 phases of the signal, and the error signal gets integrated in the "Integrator". The output of the integrator then adjusts the "VCO" which completes the feedback loop. The Feedback loop will try to make the error coming from the "Phase detector" to be zero, so that implies that the inputs to the "Phase detector" must be the same, which in-turn implies that the 2 inputs (the Reference Frequency and the "VCO" output) must be the same.

If you know the relationship between the "VCO" controlling input and the output frequency, one may extract the instantaneous phase without much difficulty.

In the circuit described in the previous figure, the 3 cores blocks of the DPLL are as follows.

1. Phase detector, (This is in the block "Up/Down Counter and Phase Align Logic")
2. Integrator, (This is in the block "Up/Down Counter and Phase Align Logic")
3. VCO, (These are the 2 adder blocks with the DFF on the bottom clocked by "Output Clock")

Using this VCO topology, the relationship between input (signal "M") number and output frequency is linear up to ½ the full scale input if you treat the input as an unsigned data. Signal "M" is "m" bits wide and is then broken into 2 parts, the MSB's and the LSB's. The MSB's are the top "os" bits and the LSB's are the bottom "m-os" bits.

In some embodiments, the up/down counter counts the edges of the clocks, either positive, negative, or both.

In some embodiments, the phase align logic makes the locked output pulses to come ½ way between the input edges clocking the input data, so that we can get data transferred across the clock domain when the data is valid (not changing).

There are now 2 adders that operate on these signals, one for the MSB's and the other for the LSB's. The reason that the adders are explicitly split up is to access the "P_OS" signal, which is simply the overflow from the adder that is operating on the LSB's. The "P_OS" is the overflow of the LSB's (also known as a carry-out) is fed into the carry-in of the MSB's adder. The result is that the digital code represented by the MSB's and LSB's is added normally but we now have access to an internal signal which is the carry-out of the Full-Adder cell that is operating on the "m-os" bit.

For example, suppose we have a 4 bit adder. Other embodiments use a different number of bits. One can make a 4-bit adder by daisy-chaining 4-Full-Adder cells. Each Full-Adder has 3 inputs and 2 outputs. The function is

| A | B | CI | CO | S |
|---|---|----|----|---|
| 0 | 0 | 0  | 0  | 0 |
| 0 | 0 | 1  | 0  | 1 |
| 0 | 1 | 0  | 0  | 1 |
| 0 | 1 | 1  | 1  | 0 |
| 1 | 0 | 0  | 0  | 1 |

-continued

| A | B | CI | CO | S |
|---|---|----|----|---|
| 1 | 0 | 1  | 1  | 0 |
| 1 | 1 | 0  | 1  | 0 |
| 1 | 1 | 1  | 1  | 1 |

A and B are the inputs to be added, and CI is the "carry-in" and CO is the "carry-out" To make a 4 bit adder one can create the "ripple carry adder" adder.

Figure 15:
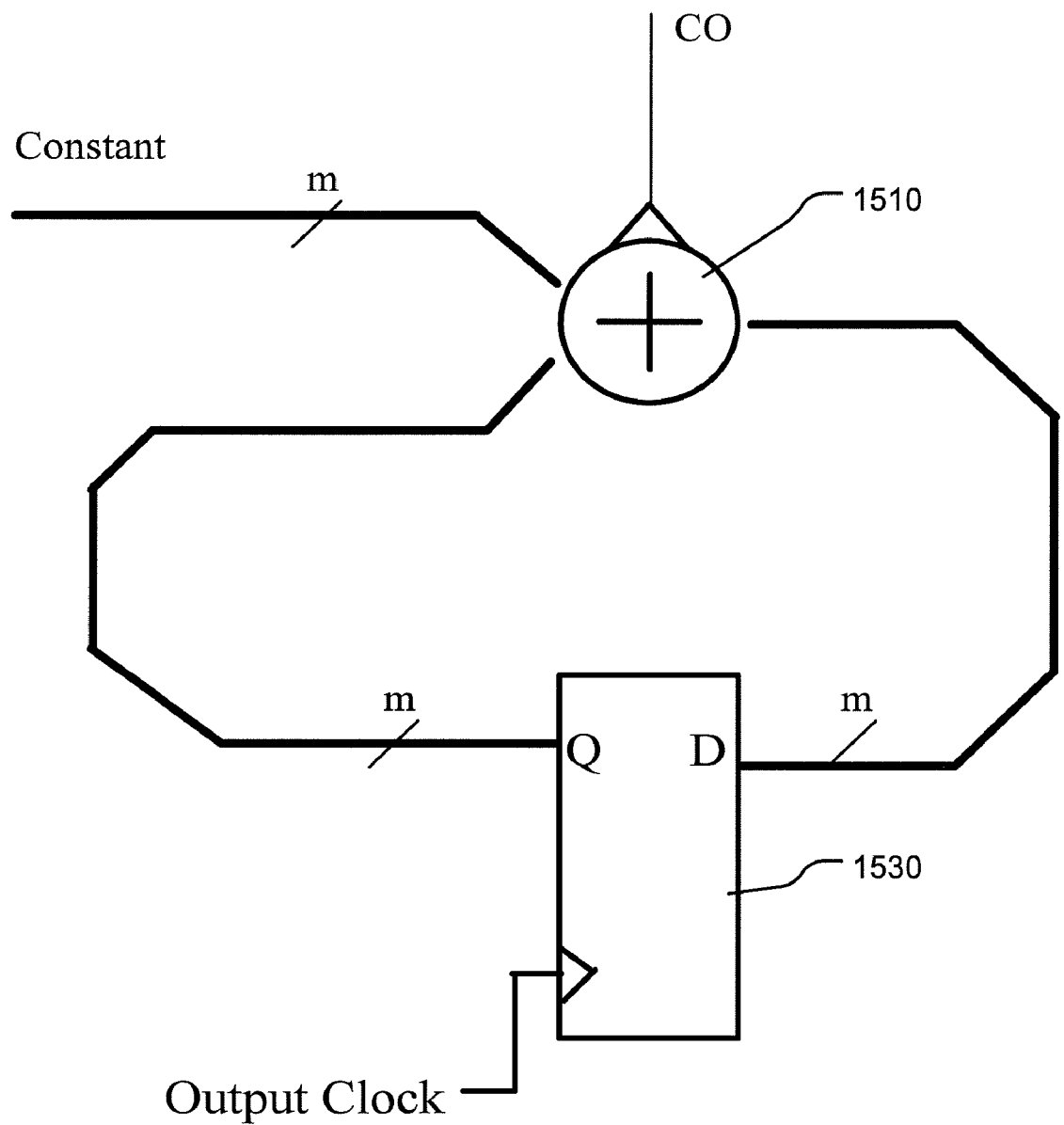
FIG. 15 shows a simple voltage controlled oscillator.

The "VCO" is made by just adding a constant to the circuit of FIG. 15. If the "m" is 8, that means the input can range from 0 to 255. When the adder output is larger than 255, it will set the "CO" bit and the rest of the bits will be latched into the FF. So when the input is a 1, the adder will overflow 1/256 clocks. If the input is 2, the overflow will occur 2/256 clocks. So this is a simple VCO, put a number in and you will get a controlled frequency output on the "CO" pin.

Suppose we take the 8-bit adder and break it into two 4-bit adders, and connect the "CO" of the first 4-bit adder to the "CI" of the second 4 bit adder.

Figure 16:
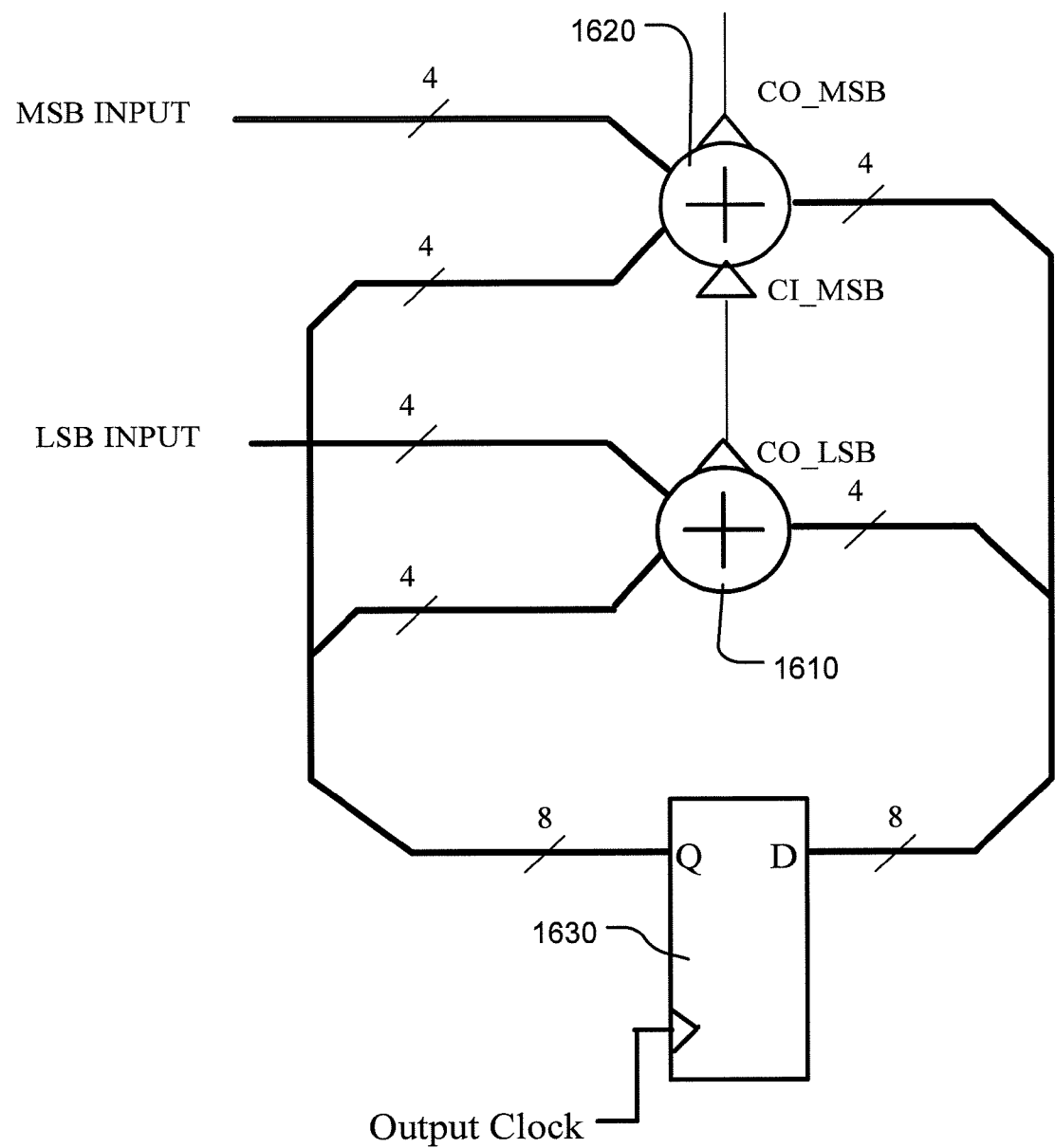
FIG. 16 shows a voltage controlled oscillator implemented by a ripple carry adder.

FIG. 16 is the same circuit as the 8 bit VCO, but now we have explicitly located the carry-out from the LSB. Putting the same inputs as above, the outputs are:

Input a constant 1 into this circuit, the carry-out of the LSB adder overflows 1/16 clocks, and the output of the MSB adder overflows 1/256 clocks, same as above. Input a constant 2 into this circuit, the carry-out of the LSB adder overflows 2/16 clocks, and the output of the MSB adder overflows 2/256 clocks, same as above. So now we have a signal that is a multiple of the MSB overflow.

Next there is 1 more thing happening, when the LSB adder overflows (at a specific multiple of the overflow rate of the MSB adder) we latch the output of the adders at that instant in time. This latched signal gives us the "instantaneous phase" relationship between the 2 asynchronous clocks, (Input Clock and Output clock). Using this instantaneous phase information, we can calculate exactly when the Input Clock (the reference) changed compared to the Output clock, even if it changed between edges of the output clock. Using this time information the sample can be corrected in amplitude in the output clock domain.

The following is another example of correcting the amplitude from timing error information.

Stream of samples. (note that there is a zero order hold on the input data stream)

...1 1 1 1 8 8 8 8 3 3 3...

Now to correct the sample where the sample changes values. (since if the sample never changes, its always right no matter when it is reclocked)

...1 1 1 X1 8 8 8 X2 3 3 3...

Now to get the new samples, we get the M and N_OS values from the DPLL at the point where the data changes and calculate as follows:

$X1=1+(N\_OS/M)*(8-1)$ $X2=8+(N\_OS/M)*(3-8)$

Note that (N_OS/M) is not a constant.

Figure 18:
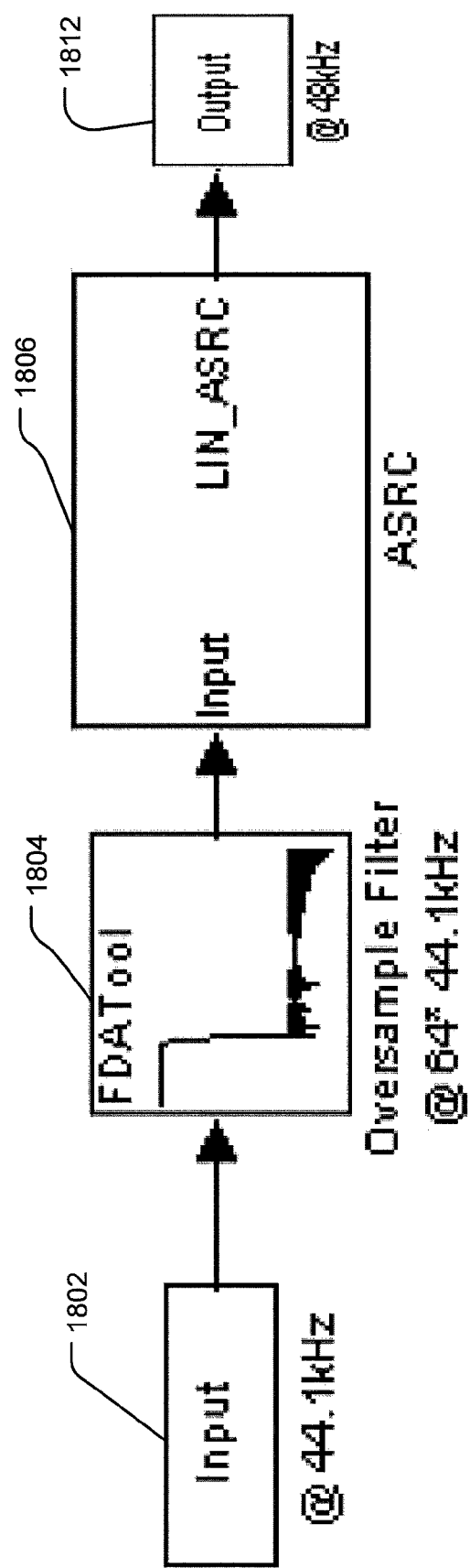
FIG. 18 shows a block diagram of an embodiment, with oversampling but not downsampling.

FIG. 18 shows a block diagram of an embodiment, with oversampling but not downsampling. The block diagram is similar to FIG. 13, but does not require the downsampling filter.

Figure 19:
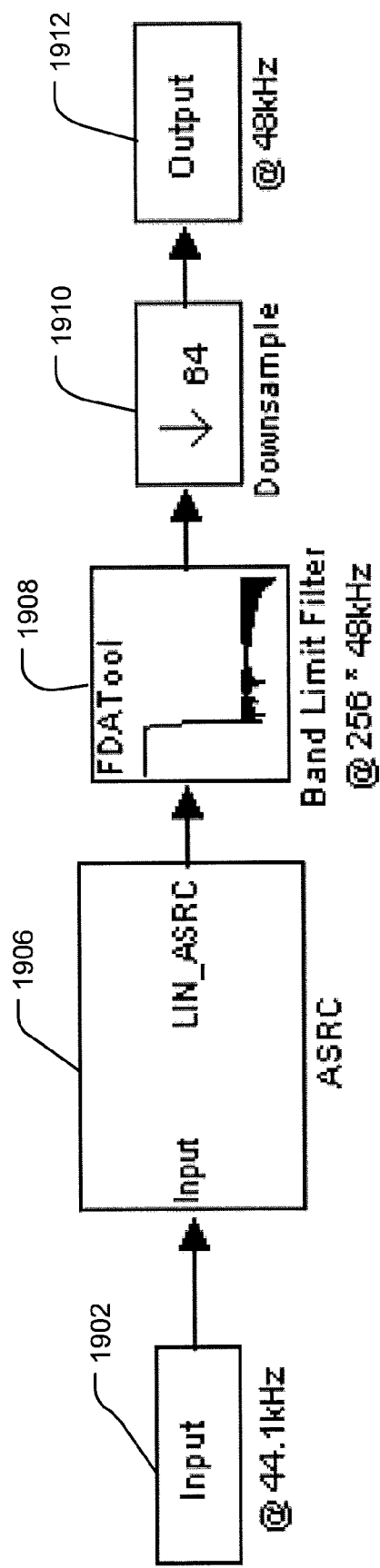
FIG. 19 shows a block diagram of an embodiment, with downsampling but not oversampling.

FIG. 19 shows a block diagram of an embodiment, with downsampling but not oversampling. The block diagram is similar to FIG. 13, but does not require the oversampling filter.

Figure 20:
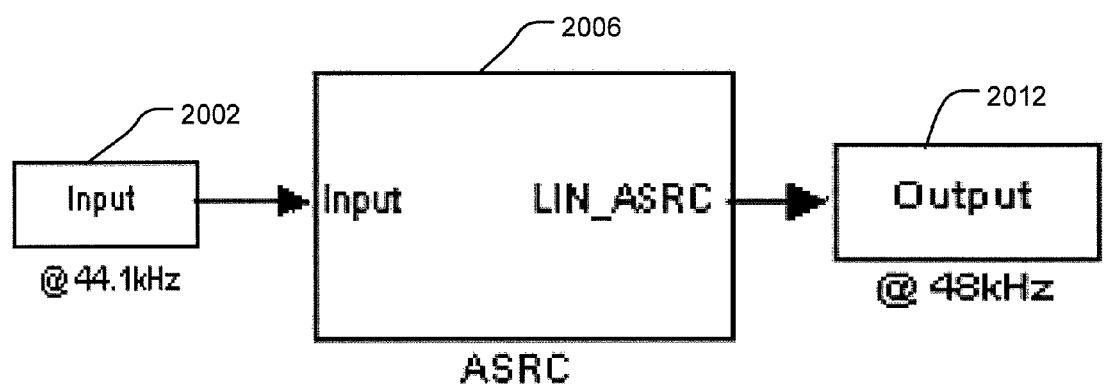
FIG. 20 shows a block diagram of an embodiment, with neither oversampling nor downsampling.

FIG. 20 shows a block diagram of an embodiment, with neither oversampling nor downsampling. The block diagram is similar to FIG. 13, but requires neither the oversampling filter nor the downsampling filter.

In the circuits of FIGS. 13, 18-20 the digital loop locks to the input rate. Alternatively, if an oversampled version of the input rate is available, the digital loop can lock to either the input rate or the oversampled version of the input rate.

The following is a discussion of THD+N (total harmonic distortion+noise).

In an embodiment with a downsampling filter, and upsampling filter implemented by FIR filters, if these filters are perfect, then the ASRC operates to the quantization noise of the input data. But if these filters are not ideal, meaning the image rejection is only −130 dB or so, then it is possible that spurious tones will show up at this level since it is in the data provided to the ASRC. It is entirely possible to make FIR filters to have >−200 dB image rejection, and in this case, the ASRC would be limited only by input data quantization noise.

Another embodiment is a computer program implementing the following algorithm. The algorithm accesses an ordered sequence of data representing samples of a signal taken with a first regular timebase (dt1) and creates a second ordered sequence of samples representative of the same signal in a second, different, time base (dt2), the two timebases not being integer related.

A possible intermediate ordered set of samples at a third timebase (dt3) is an integer fraction of the second timebase (dt3=dt2/F, F {0, . . . INF}). This third timebase is required when the second timebase is not substantially shorter than the first (ie NOT(dt2<<dt1)).

The algorithm includes exemplary procedures as follows:

A procedure (p1) by which samples of the first sequence are copied into successive elements of the third sequence (or second sequence if no third sequence is used) until the equivalent time of the third (or second) sequence (t3) exceeds the time of the next element of the first sequence (t1).

A procedure (p2) is executed after p1 (i.e. when the equivalent time of the third (or second) sequence (t3) exceeds the time of the next element of the first sequence (t1)). This procedure fills the single pending element of the third (or second) sequence with a value (y) derived from the current element of the first sequence (s1) and the next element of the first sequence (s2) as follows: y=s1+(t3−t1)(s2−s1)/dt3; or y=s1+(t3−t1)(s2−s1)/dt2 if the third sequence is not used.

A procedure (p3) is executed after p2 that increments the sequence pointer of the first sequence such that the equivalent time of the first sequence now exceeds the equivalent time of the third (or second) sequence. Procedure p1 is then recalled.

The process continues until p3 encounters the end of the first sequence. At this point a sequence of output data exists in either the third or the second sequence. If the third sequence has been used, the third sequence may be down-sampled into the second sequence. The second sequence is now the representation of the first sequence in the second sequence's timebase.

The algorithm is carried out, for example, in one or more computing processors.

We claim:

1. A method, comprising:
performing sample rate conversion of a sample series at an input rate to an output rate, the output rate being different from any integer multiple of the input rate, including:
correcting a version of the sample series with timing error information generated by a digital loop, the digital loop locked to a first rate being a multiple of the input rate and clocked at a second rate being a multiple of the output rate, the second rate being different from any integer multiple of the first rate.

2. The method of claim 1, wherein the first rate is the multiple of the input rate, the multiple of the input rate being one, such that the version of the sample series is equal to the sample series at the input rate.

3. The method of claim 1, wherein the first rate is the multiple of the input rate, the multiple of the input rate being an integer greater than one, such that the version of the sample series is an oversampled version of the sample series at the input rate.

4. The method of claim 1, wherein the second rate is the multiple of the output rate, the multiple of the output rate being one, such that the second rate is equal to the output rate.

5. The method of claim 1, wherein the second rate is the multiple of the output rate, the multiple of the output rate being an integer greater than one.

6. The method of claim 1, further comprising:
generating the version of the sample series by clocking at the second rate, the version of the sample series including timing errors due to clocking at the second rate rather than any integer multiple of the input rate.

7. The method of claim 1, wherein said performing further comprises:
correcting amplitudes of the version of the sample series with the timing error information.

8. The method of claim 1, further comprising:
generating, with arithmetic circuitry, a plurality of modular overflows at an overflow rate adjusted to the first rate locking the digital loop, each of the plurality of modular overflows indicating generation by the arithmetic circuitry of timing error information between the first rate and the second rate.

9. The method of claim 1, wherein the sample series at the input rate is from an S/PDIF (Sony/Philips Digital Interface Format) signal.

10. The method of claim 1, wherein the sample rate conversion has a dynamic range limited primarily by input quantization noise.

11. The method of claim 1, wherein the sample rate conversion has a dynamic range limited primarily by input quantization noise, image rejection of an oversampling finite impulse response filter, and image rejection of a downsampling finite impulse response filter.

12. The method of claim 1, wherein the sample rate conversion has a maximum downsampling ratio limited primarily by the output rate.

13. The method of claim 1, wherein the sample rate conversion has a maximum oversampling ratio limited primarily by a rate limitation characterizing logic synthesis of the circuit.

14. A circuit performing sample rate conversion of a sample series at an input rate to an output rate, the output rate being different from any integer multiple of the input rate, comprising:
a digital loop locked to a first rate being a multiple of the input rate and clocked at a second rate being a multiple of the output rate, the second rate being different from any integer multiple of the first rate, including:
frequency detection and low pass filter circuitry; and
variable oscillator circuitry forming the digital loop with the frequency detection and low pass filter circuitry, wherein the digital loop generates timing error information; and
circuitry correcting the version of the sample series with the timing error information.

15. The circuit of claim 14, wherein the first rate is the multiple of the input rate, the multiple of the input rate being one, such that the version of the sample series is equal to the sample series at the input rate.

16. The circuit of claim 14, wherein the first rate is the multiple of the input rate, the multiple of the input rate being an integer greater than one, such that the version of the sample series is an oversampled version of the sample series at the input rate.

17. The circuit of claim 14, wherein the second rate is the multiple of the output rate, the multiple of the output rate being one, such that the second rate is equal to the output rate.

18. The circuit of claim 14, wherein the second rate is the multiple of the output rate, the multiple of the output rate being an integer greater than one.

19. The circuit of claim 14, further comprising:
circuitry generating the oversampled version of the sample series by clocking at the second rate, the oversampled version including timing errors due to clocking at the second rate rather than any integer multiple of the input rate.

20. The circuit of claim 14, further comprising:
circuitry correcting amplitudes of the oversampled version of the sample series with the timing error information.

21. The circuit of claim 14, wherein the variable oscillator circuitry includes finite modulus arithmetic circuitry.

22. The circuit of claim 14, wherein the digital loop generates timing error information between the input rate and the second rate.

23. The circuit of claim 14, wherein the digital loop generates timing error information between the first rate and the second rate.

24. The circuit of claim 14, wherein the variable oscillator circuitry includes carry adder circuitry, the carry adder circuitry including:
more significant bit circuitry; and
less significant bit circuitry coupled to the more significant bit circuitry, wherein the less significant bit circuitry generates an overflow, the overflow indicating generation by the carry adder circuitry of timing error information between the input rate and the second rate.

25. The circuit of claim 14, wherein the variable oscillator circuitry includes carry adder circuitry, the carry adder circuitry including:
more significant bit circuitry; and
less significant bit circuitry coupled to the more significant bit circuitry, wherein the less significant bit circuitry generates an overflow, the overflow indicating generation by the carry adder circuitry of timing error information between the first rate and the second rate.

26. The circuit of claim 14, wherein the sample series at the input rate is from an S/PDIF (Sony/Philips Digital Interface Format) signal.

27. The circuit of claim 14, further comprising an input integrated with the circuit, the input receiving the sample series at the input rate from an S/PDIF (Sony/Philips Digital Interface Format) signal.

28. The circuit of claim 14, wherein the circuit has a dynamic range limited primarily by input quantization noise.

29. The circuit of claim 14, wherein the circuit has a dynamic range limited primarily by input quantization noise, image rejection of an oversampling finite impulse response filter, and image rejection of a downsampling finite impulse response filter.

30. The circuit of claim 14, wherein the circuit has a maximum downsampling ratio limited primarily by the output rate.

31. The circuit of claim 14, wherein the circuit has a maximum oversampling ratio limited primarily by a rate limitation characterizing logic synthesis of the circuit.

32. A circuit, comprising:

means for performing sample rate conversion of a sample series at an input rate to an output rate, the output rate being different from any integer multiple of the input rate, including:

means for correcting a version of the sample series with timing error information generated by a digital loop, the digital loop locked to a first rate being a multiple of the input rate and clocked at a second rate being a multiple of the output rate, the second rate being different from any integer multiple of the first rate.

* * * * *